(12) United States Patent
Itou et al.

(10) Patent No.: US 11,936,350 B2
(45) Date of Patent: Mar. 19, 2024

(54) POWER AMPLIFIER CIRCUIT

(71) Applicant: Murata Manufacturing Co., Ltd., Kyoto (JP)

(72) Inventors: Makoto Itou, Kyoto (JP); Satoshi Arayashiki, Kyoto (JP); Satoshi Goto, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 454 days.

(21) Appl. No.: 17/374,065

(22) Filed: Jul. 13, 2021

(65) Prior Publication Data
US 2022/0021358 A1    Jan. 20, 2022

(30) Foreign Application Priority Data

Jul. 14, 2020 (JP) .................................. 2020-120822

(51) Int. Cl.
*H03F 3/24* (2006.01)
*H03F 1/02* (2006.01)

(52) U.S. Cl.
CPC .......... *H03F 3/245* (2013.01); *H03F 1/0211* (2013.01); *H03F 2200/222* (2013.01); *H03F 2200/451* (2013.01)

(58) Field of Classification Search
CPC ............................... H03F 3/245; H03F 1/0211

USPC ........................................................ 330/296
See application file for complete search history.

(56) References Cited

U.S. PATENT DOCUMENTS

| | | | |
|---|---|---|---|
| 7,057,461 B1 * | 6/2006 | Canilao ................ | H03F 1/0211 |
| | | | 330/296 |
| 2016/0315594 A1 | 10/2016 | Arayashiki et al. | |
| 2018/0342992 A1 * | 11/2018 | Sato ........................ | H03F 3/213 |
| 2019/0068129 A1 * | 2/2019 | Ito ............................ | H03F 3/191 |
| 2020/0052658 A1 * | 2/2020 | Honda ..................... | H03F 3/21 |
| 2021/0126600 A1 * | 4/2021 | Sukemori ............... | H03F 3/303 |
| 2021/0313938 A1 * | 10/2021 | Tanaka .................. | H03F 1/0288 |
| 2021/0336591 A1 * | 10/2021 | Yanagihara ............. | H03F 3/245 |

FOREIGN PATENT DOCUMENTS

JP        2016-208305 A       12/2016

* cited by examiner

*Primary Examiner* — Patricia T Nguyen
(74) *Attorney, Agent, or Firm* — Pearne & Gordon LLP

(57) ABSTRACT

A power amplifier circuit includes a first transistor having a first terminal to which a first signal inputs, a second transistor having a first terminal to which the first signal inputs, a first resistor having a first end to which a first bias current is supplied and a second end electrically connected to the first terminal of the first transistor, a second resistor having a first end to which a second bias current is supplied and a second end electrically connected to the first terminal of the second transistor, and a third resistor having a first end connected to the first end of the first resistor and a second end connected to the first end of the second resistor.

9 Claims, 24 Drawing Sheets

POWER AMPLIFIER CIRCUIT

CROSS REFERENCE TO RELATED APPLICATION

This application claims priority from Japanese Patent Application No. 2020-120822 filed on Jul. 14, 2020. The content of this application is incorporated herein by reference in its entirety.

BACKGROUND OF THE DISCLOSURE

Field of the Disclosure

The present disclosure relates to a power amplifier circuit.

Description of the Related Art

In mobile communication devices, such as cellular phone devices, power amplifier circuits are used for the amplification of power of signals to be transmitted to base stations. In such a power amplifier circuit, a gain is sometimes changed in accordance with an output level for the improvement of power added efficiency (PAE).

Japanese Unexamined Patent Application Publication No. 2016-208305 discloses a technique with which a first resistor is electrically connected between a first bias circuit for outputting a first bias current in a high-output mode of operation and each of bases of a first transistor and a second transistor. A second resistor is electrically connected between a second bias circuit for outputting a second bias current in a low-output mode of operation and the base of the second transistor. In the low-output mode of operation, the second bias current is supplied to the base of the second transistor via the second resistor and is also supplied to the base of the first transistor via the second resistor and the first resistor. As a result, the first transistor is brought into a state of not being completely switched off in the low-output mode of operation. This leads to the suppression of the change in an input impedance.

With the technique disclosed in Japanese Unexamined Patent Application Publication No. 2016-208305, the bias current supplied to the base of the first transistor becomes large to some degree and the operating point of the first transistor becomes high to some degree in the low-output mode of operation. Accordingly, the gain of the first transistor becomes high to some degree. The gain of a power amplifier circuit therefore becomes high to some degree in the low-output mode of operation. However, there is a need to further reduce the gain of the power amplifier circuit in the low-output mode of operation.

BRIEF SUMMARY OF THE DISCLOSURE

The present disclosure has been made to solve the above problem, and it is an object of the present disclosure to suppress a gain in a low-output mode of operation while suppressing the change in an input impedance.

A power amplifier circuit according to an aspect of the present disclosure includes at least one first transistor having a first terminal to which a first signal inputs and a second terminal, at least one second transistor having a first terminal to which the first signal inputs and a second terminal electrically connected to the second terminal of the at least one first transistor, at least one first resistor having a first end to which a first bias current is supplied and a second end electrically connected to the first terminal of the at least one first transistor, at least one second resistor having a first end to which a second bias current is supplied and a second end electrically connected to the first terminal of the at least one second transistor, and a third resistor having a first end electrically connected to the first end of the at least one first resistor and a second end electrically connected to the first end of the at least one second resistor.

According to an embodiment of the present disclosure, the suppression of a gain in a low-output mode of operation can be achieved while the suppression of the change in an input impedance is achieved. Other features, elements, characteristics and advantages of the present disclosure will become more apparent from the following detailed description of preferred embodiments of the present disclosure with reference to the attached drawings.

DETAILED DESCRIPTION OF THE DISCLOSURE

Power amplifier circuits according to embodiments of the present disclosure will be described in detail below with reference to the drawings. It is to be noted that the present disclosure is not limited to the embodiments. The embodiments are illustrative, and, needless to say, a partial replacement or combination of configurations described in the different embodiments is possible. In the second and subsequent embodiments, the descriptions of the matters common to those in the first embodiment will be omitted and only different points will be described. In particular, the descriptions of the similar advantageous effects obtained with similar configurations will not be repeated in each of the embodiments.

First Embodiment and Comparative Example

Although the first embodiment will be described below, a comparative example will be described first for ease of understanding of the first embodiment.

First Comparative Example

Figure 1:
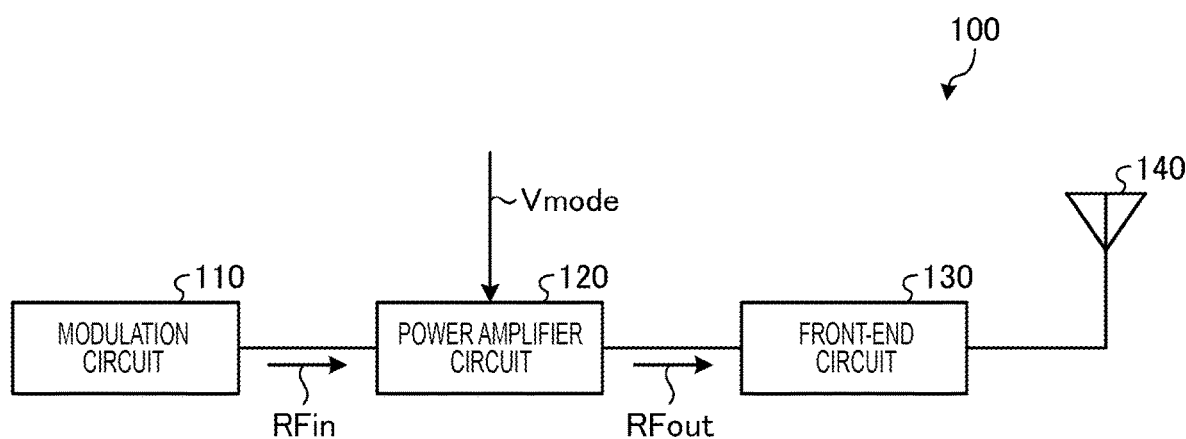
FIG. 1 is a diagram illustrating the configuration of a transmission unit including a power amplifier circuit according to a first comparative example.

FIG. 1 is a diagram illustrating the configuration of a transmission unit including a power amplifier circuit according to the first comparative example. A transmission unit 100 is used to transmit various signals including audio signals and data signals to a base station in a mobile communication device, such as a cellular phone. A mobile communication device also includes a reception unit for receiving signals from a base station, but the description thereof will be omitted.

As illustrated in FIG. 1, the transmission unit 100 includes a modulation circuit 110, a power amplifier circuit 120, a front-end circuit 130, and an antenna 140.

The modulation circuit 110 modulates an input signal using a modulation scheme such as HSUPA (high-speed uplink packet access), LTE (long-term evolution), or 5G (5th generation mobile communication system) to generate a radio-frequency (RF) signal for radio transmission. For example, the frequency of a radio-frequency signal ranges from several hundreds of MHz to several tens of GHz, but may be any frequency.

The power amplifier circuit 120 amplifies the power of a radio-frequency input signal RFin outputted from the modulation circuit 110 up to a level required for the transmission of the radio-frequency input signal RFin to a base station and outputs a radio-frequency output signal RFout.

The power amplifier circuit 120 operates in an operation mode corresponding to an operation mode control voltage Vmode. The operation mode is a first operation mode (high-output mode of operation) or a second operation mode (low-output mode of operation) in which a gain is relatively lower than that in the first operation mode.

The front-end circuit 130 performs filtering upon the radio-frequency output signal RFout, switching between the radio-frequency output signal RFout and a reception signal received from a base station, and so forth. The radio-frequency output signal RFout outputted from the front-end circuit 130 is transmitted to a base station via the antenna 140.

Figure 2:
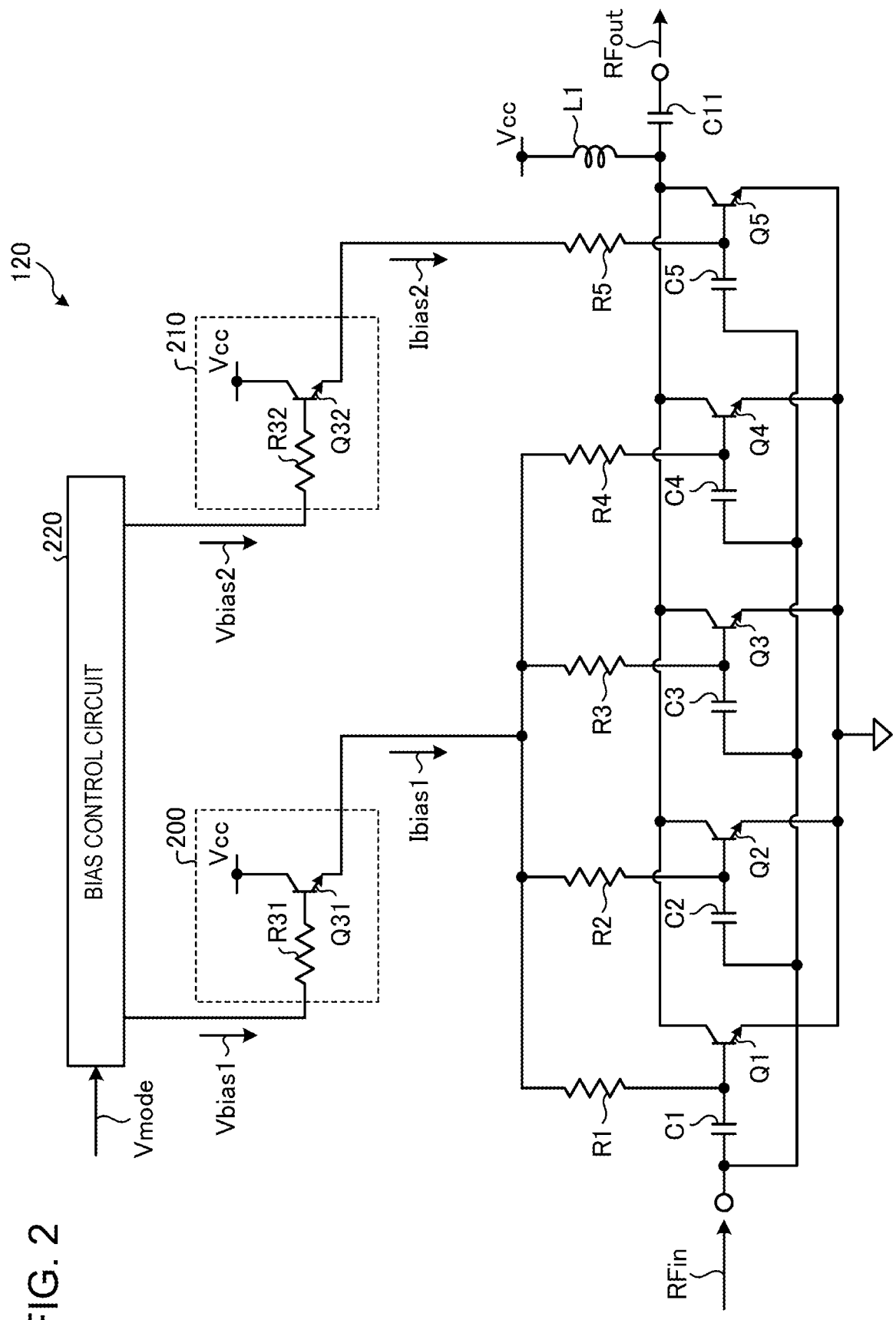
FIG. 2 is a diagram illustrating the configuration of a power amplifier circuit according to the first comparative example.

FIG. 2 is a diagram illustrating the configuration of a power amplifier circuit according to the first comparative example. The power amplifier circuit 120 includes transistors Q1 to Q5, capacitors C1 to C5 and C11, ballast resistors R1 to R5, a choke coil L1, bias circuits 200 and 210, and a bias control circuit 220.

The transistors Q1 to Q5 are amplification transistors and are, for example, heterojunction bipolar transistors (HBTs), but the present disclosure is not limited thereto. Each of the transistors Q1 to Q5 is, for example, a single unit transistor (finger) in a multi-finger transistor, but the present disclosure is not limited thereto. That is, the transistors Q1 to Q5 form, for example, a multi-finger transistor, but the present disclosure is not limited thereto.

In the present disclosure, each transistor is a bipolar transistor, but the present disclosure is not limited thereto. Each transistor may be, for example, a field effect transistor (FET) or a multi-finger transistor in which a plurality of unit transistors are electrically connected in parallel. The unit transistor refers to a minimum structure constituting a transistor.

The base or gate of each transistor corresponds to a "first terminal" in the present disclosure. The collector or drain of each transistor corresponds to a "second terminal" in the present disclosure. The emitter or source of each transistor corresponds to a "third terminal in the present disclosure.

The transistors Q1 to Q5 are electrically connected in parallel to form a single amplifier circuit. The emitters of the transistors Q1 to Q5 are electrically connected to a reference potential. The reference potential is, for example, a ground potential, but the present disclosure is not limited thereto. The radio-frequency input signal RFin is inputted to the bases of the transistors Q1 to Q5 via the capacitors C1 to C5, respectively, which are DC cut capacitors. The collectors of the transistors Q1 to Q5 are electrically connected to a power supply potential Vcc via the choke coil L1. Each of the transistors Q1 to Q5 outputs the radio-frequency output signal RFout from the collector thereof via the capacitor C11. A variable voltage may be supplied from a DC-DC converter to the power supply potential Vcc or a voltage based on an envelope of a modulation signal may be supplied to the power supply potential Vcc.

The ballast resistor R1 has one end to which part of a bias current Ibias1 (ideally, a quarter of the bias current Ibias1) is supplied and the other end electrically connected to the base of the transistor Q1. The ballast resistor R2 has one end to which part of the bias current Ibias1 (ideally, a quarter of the bias current Ibias1) is supplied and the other end electrically connected to the base of the transistor Q2. The ballast resistor R3 has one end to which part of the bias current Ibias1 (ideally, a quarter of the bias current Ibias1) is supplied and the other end electrically connected to the base of the transistor Q3. The ballast resistor R4 has one end to which part of the bias current Ibias1 (ideally, a quarter of the bias current Ibias1) is supplied and the other end electrically connected to the base of the transistor Q4. The ballast resistor R5 has one end to which a bias current Ibias2 is supplied and the other end electrically connected to the base of the transistor Q5.

The bias circuit 200 generates the bias current Ibias1 on the basis of a bias control voltage and current Vbias1. The bias circuit 200 includes a transistor Q31. The transistor Q31 is, for example, a heterojunction bipolar transistor (HBT), but the present disclosure is not limited thereto. The transistor Q31 has a base to which the bias control voltage and current Vbias1 is supplied via a resistor R31, a collector electrically connected to the power supply potential Vcc, and an emitter electrically connected to one ends of the ballast resistors R1 to R4. That is, the transistor Q31 and each of the ballast resistors R1 to R4 are connected to form an emitter follower, but the present disclosure is not limited thereto.

The bias circuit 210 generates the bias current Ibias2 on the basis of a bias control voltage and current Vbias2. The bias circuit 210 includes a transistor Q32. The transistor Q32 is, for example, a heterojunction bipolar transistor (HBT), but the present disclosure is not limited thereto. The transistor Q32 has a base to which the bias control voltage and current Vbias2 is supplied via a resistor R32, a collector electrically connected to the power supply potential Vcc, and an emitter electrically connected to one end of the ballast resistor R5. That is, the transistor Q32 and the ballast resistor R5 are connected to form an emitter follower.

The bias control circuit 220 controls the bias control voltage and current Vbias1 and the bias control voltage and current Vbias2 in accordance with the operation mode control voltage Vmode. Specifically, the bias control voltage and current Vbias1 is controlled to a high level and the bias control voltage and current Vbias2 is controlled to a low level by the bias control circuit 220 when the operation mode control voltage Vmode indicates the first operation mode. The bias control voltage and current Vbias1 is controlled to the low level and the bias control voltage and current Vbias2 is controlled to the high level by the bias control circuit 220 when the operation mode control voltage Vmode indicates the second operation mode. The high level represents a voltage higher than a threshold voltage at which the transistor Q31 in the bias circuit 200 and the transistor Q32 in the bias circuit 210 are turned on, and the low level represents a voltage lower than the threshold value.

In the first operation mode, a current is not supplied to the base of the transistor Q5 and the transistor Q5 is completely turned off in the power amplifier circuit 120. That is, the four transistors Q1 to Q4 are brought into the ON state and the single transistor Q5 is completely brought into the OFF state. In the second operation mode, a current is not supplied to the bases of the transistor Q1 to Q4 and the transistors Q1 to Q4 are completely turned off in the power amplifier circuit 120. That is, the four transistors Q1 to Q4 are completely brought into the OFF state and the single transistor Q5 is brought into the ON state.

Thus, the number of ON-state transistors differs in the first operation mode (four) and the second operation mode (one) in the power amplifier circuit 120. Accordingly, the input impedance of the power amplifier circuit 120 significantly differs in the first operation mode and the second operation mode. Since the state of impedance matching between the power amplifier circuit 120 and a preceding circuit is therefore lost, the radio-frequency input signal RFin is reflected and does not enter the power amplifier circuit 120 because of the mismatching. This leads to the reduction in output level.

Second Comparative Example

Figure 3:
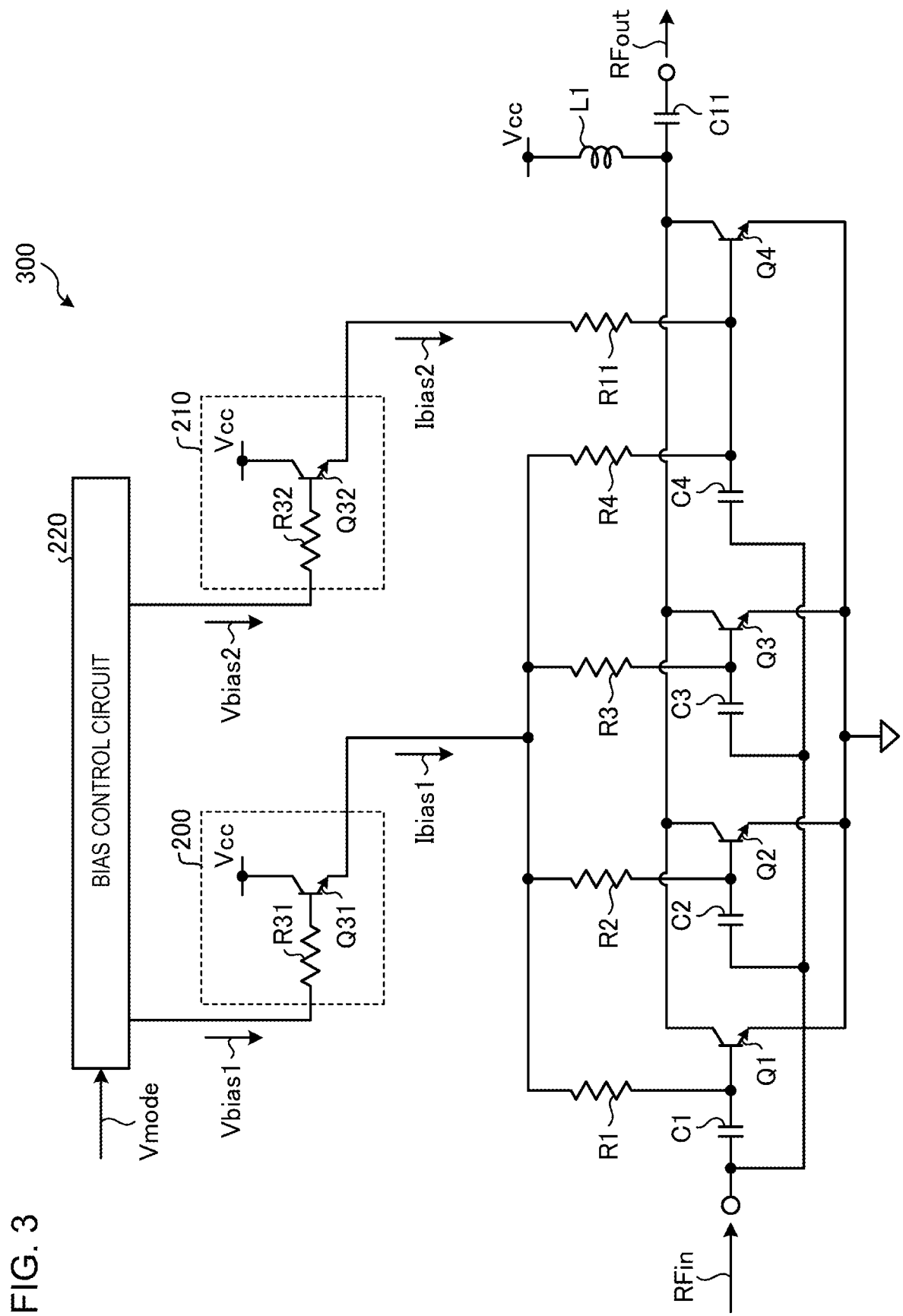
FIG. 3 is a diagram illustrating the configuration of a power amplifier circuit according to a second comparative example.

FIG. 3 is a diagram illustrating the configuration of a power amplifier circuit according to the second comparative example.

In a power amplifier circuit 300 according to the second comparative example, the same reference numerals are used to represent the same components in the power amplifier circuit 120 according to the first comparative example and the description thereof will be omitted.

The power amplifier circuit 300 includes the transistors Q1 to Q4. The transistors Q1 to Q4 are electrically connected in parallel to form a single amplifier circuit.

The power amplifier circuit 300 includes a ballast resistor R11. The ballast resistor R11 has one end to which the bias current Ibias2 is supplied and the other end electrically connected to the base of the transistor Q4.

The emitter of the transistor Q31 is electrically connected to one ends of the ballast resistors R1 to R4.

The emitter of the transistor Q32 is electrically connected to one end of the ballast resistor R11.

Figure 4:
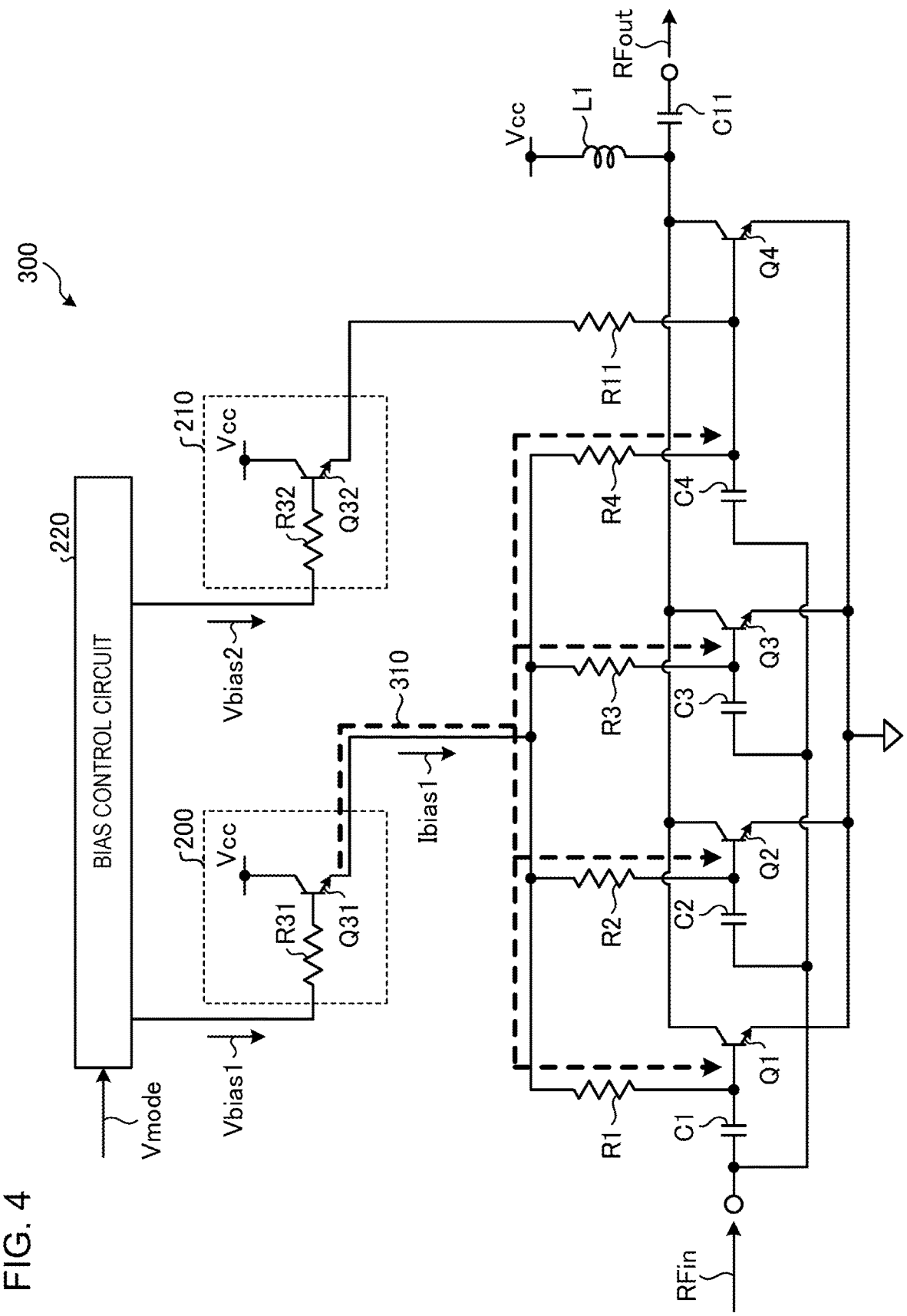
FIG. 4 is a diagram describing the operation of a power amplifier circuit according to the second comparative example.
Figure 5:
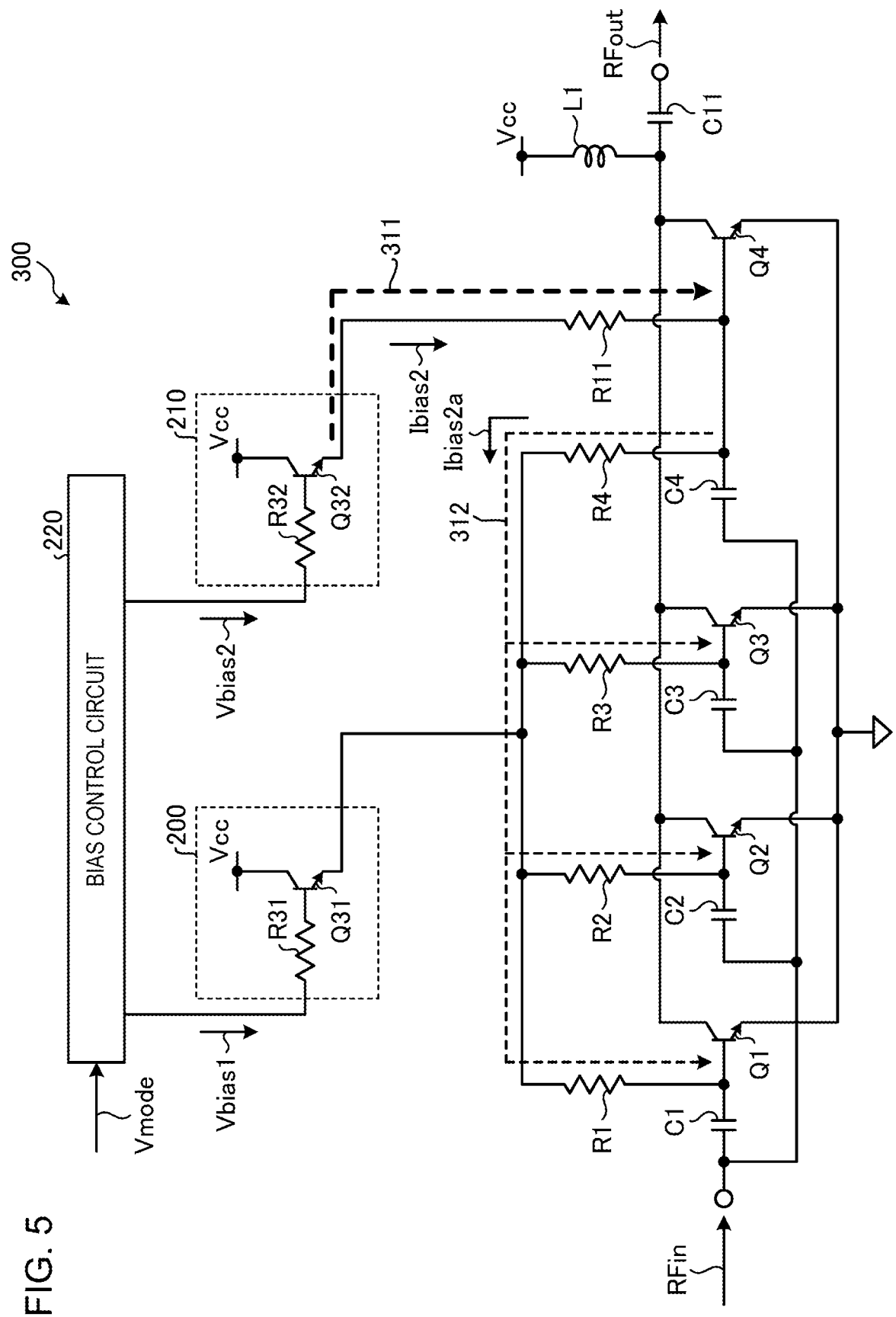
FIG. 5 is a diagram describing the operation of a power amplifier circuit according to the second comparative example.

FIGS. 4 and 5 are diagrams describing the operation of a power amplifier circuit according to the second comparative example. Specifically, FIG. 4 is a diagram describing the operation of the power amplifier circuit 300 in the first operation mode. FIG. 5 is a diagram illustrating the operation of the power amplifier circuit 300 in the second operation mode.

Referring to FIG. 4, the bias control voltage and current Vbias1 is controlled to the high level and the bias control voltage and current Vbias2 is controlled to the low level by the bias control circuit 220 in the first operation mode. As a result, the transistor Q31 in the bias circuit 200 is turned on and the transistor Q32 in the bias circuit 210 is turned off. Accordingly, the bias current Ibias1 is outputted from the bias circuit 200 as represented by an arrow 310. The bias current Ibias2 is not outputted from the bias circuit 210.

As represented by the arrow 310, part of the bias current Ibias1 (ideally, a quarter of the bias current Ibias1) is supplied to the base of the transistor Q1 via the ballast resistor R1. Part of the bias current Ibias1 (ideally, a quarter of the bias current Ibias1) is similarly supplied to the base of the transistor Q2 via the ballast resistor R2. Part of the bias current Ibias1 (ideally, a quarter of the bias current Ibias1) is similarly supplied to the base of the transistor Q3 via the ballast resistor R3. Part of the bias current Ibias1 (ideally, a quarter of the bias current Ibias1) is similarly supplied to the base of the transistor Q4 via the ballast resistor R4.

As a result, the transistors Q1 to Q4 are turned on. Accordingly, the radio-frequency input signal RFin is amplified by the transistors Q1 to Q4.

Referring to FIG. 5, the bias control voltage and current Vbias1 is controlled to the low level and the bias control voltage and current Vbias2 is controlled to the high level by the bias control circuit 220 in the second operation mode. As a result, the transistor Q31 in the bias circuit 200 is turned off and the transistor Q32 in the bias circuit 210 is turned on. Accordingly, the bias current Ibias2 is outputted from the bias circuit 210 as represented by an arrow 311. The bias current Vbias1 is not outputted from the bias circuit 200.

As represented by the arrow 311, large part of the bias current Ibias2 is supplied to the base of the transistor Q4 via the ballast resistor R11.

As a result, the transistor Q4 is turned on. Accordingly, the radio-frequency input signal RFin is amplified by the transistor Q4.

As represented by an arrow 312, a current Ibias2a that is a remainder of the bias current Ibias2 flows to the ballast resistors R1 to R3 via the ballast resistor R4. Part of the current Ibias2a (ideally, one-third of the current Ibias2a) is supplied to the base of the transistor Q1 via the ballast resistors R4 and R1. Part of the current Ibias2a (ideally, one-third of the current Ibias2a) is similarly supplied to the base of the transistor Q2 via the ballast resistors R4 and R2. Part of the current Ibias2a (ideally, one-third of the current Ibias2a) is similarly supplied to the base of the transistor Q3 via the ballast resistors R4 and R3. Each of the values of currents supplied to the bases of the transistors Q1 to Q3 is smaller than that of a current supplied to the base of the transistor Q4. Accordingly, although the transistors Q1 to Q3 are not completely turned off, the emitter current value per unit emitter area of each of the transistors Q1 to Q3 is smaller than that of the transistor Q4. The gains of the transistors Q1 to Q3 are therefore lower than those in the first operation mode described with reference to FIG. 4.

As described with reference to FIGS. 4 and 5, in the first operation mode, the bias current Ibias1 is supplied to the bases of the transistors Q1 to Q4, so that the transistors Q1 to Q4 are turned on in the power amplifier circuit 300. In the second operation mode, large part of the bias current Ibias2 is supplied to the base of the transistor Q4, so that the transistor Q4 is turned on in the power amplifier circuit 300. The remainder of the bias current Ibias2 is also supplied to the bases of the transistors Q1 to Q3 via the ballast resistor R4, so that the transistors Q1 to Q3 are not completely turned off.

The power amplifier circuit 300 can change a gain by switching between the first operation mode and the second operation mode.

In the second operation mode, the transistors Q1 to Q3 are not completely turned off in the power amplifier circuit 300. That is, the number of ON-state transistors is the same in the first operation mode and the second operation mode in the power amplifier circuit 300. The power amplifier circuit 300 can further suppress the change in an input impedance as compared with the power amplifier circuit 120.

(Aspect of Challenge)

For example, the resistance values of the ballast resistors R1 to R4 and R11 range from approximately 100Ω (ohms) to approximately 200Ω. The resistance values of the ballast resistors R1 to R4 and R11 cannot be further increased because of the limitation of a chip layout. Accordingly, in the second operation mode, the current represented by the arrow 312 in FIG. 5 becomes large to some degree and the operating points of the transistors Q1 to Q3 become high to some degree. Accordingly, the gains of transistors Q1 to Q3 become high to some degree. The gain of the power amplifier circuit 300 in the second operation mode therefore becomes high to some degree. However, there is a need to further reduce the gain of the power amplifier circuit 300 in the second operation mode.

First Embodiment

Figure 6:
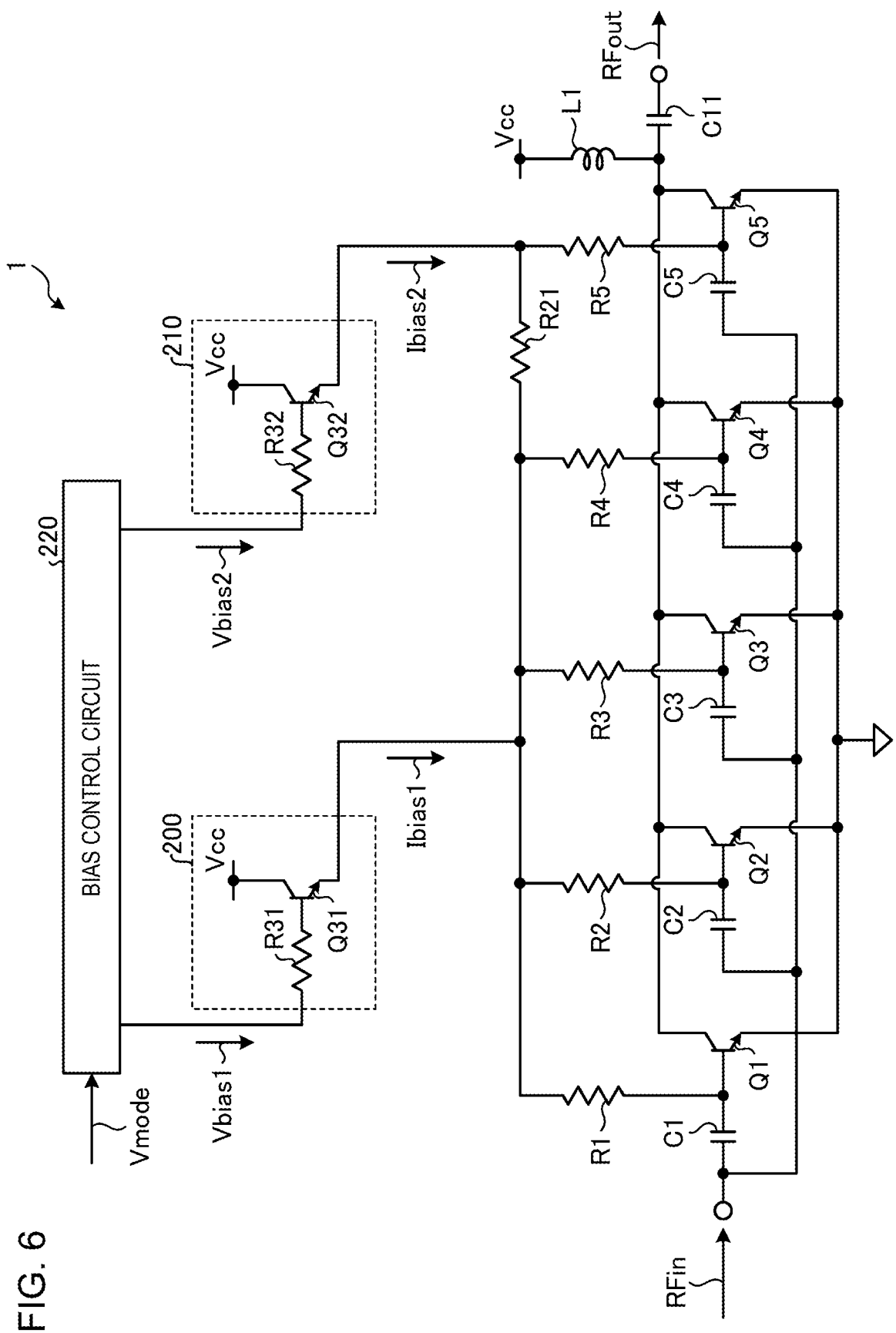
FIG. 6 is a diagram illustrating the configuration of a power amplifier circuit according to a first embodiment.

FIG. 6 is a diagram illustrating the configuration of a power amplifier circuit according to the first embodiment.

In a power amplifier circuit 1 according to the first embodiment, the same reference numerals are used to represent the same components in the power amplifier circuit 120 according to the first comparative example and the power amplifier circuit 300 according to the second comparative example and the description thereof will be omitted.

The power amplifier circuit 1 differs from the power amplifier circuit 120 according to the first comparative example in that it further includes a coupling resistor R21.

In the first embodiment, the transistors Q1 to Q4 correspond to "at least one first transistor" in the present disclosure. The transistor Q5 corresponds to "at least one second transistor" in the present disclosure. The ballast resistors R1 to R4 correspond to "at least one first resistor" in the present disclosure. The ballast resistor R5 corresponds to "at least one second resistor" in the present disclosure. The coupling resistor R21 corresponds to a "third resistor" in the present disclosure. The bias current Ibias1 corresponds to a "first bias current" in the present disclosure. The bias current Ibias2 corresponds to a "second bias current" in the present disclosure. The radio-frequency input signal RFin corresponds to a "first signal" in the present disclosure. The radio-frequency output signal RFout corresponds to a "second signal" in the present disclosure.

One end of the coupling resistor R21 is electrically connected to one ends of the ballast resistors R1 to R4. The other end of the coupling resistor R21 is electrically connected to one end of the ballast resistor R5. The resistance value of the coupling resistor R21 can be larger than that of the ballast resistors R1 to R5 (for example, approximately 100Ω to approximately 200Ω) because of no limitation of a chip layout. For example, the resistance value of the coupling resistor R21 ranges from approximately 1 kΩ (kilohm) to approximately 1.5 kΩ, but the present disclosure is not limited thereto.

Figure 7:
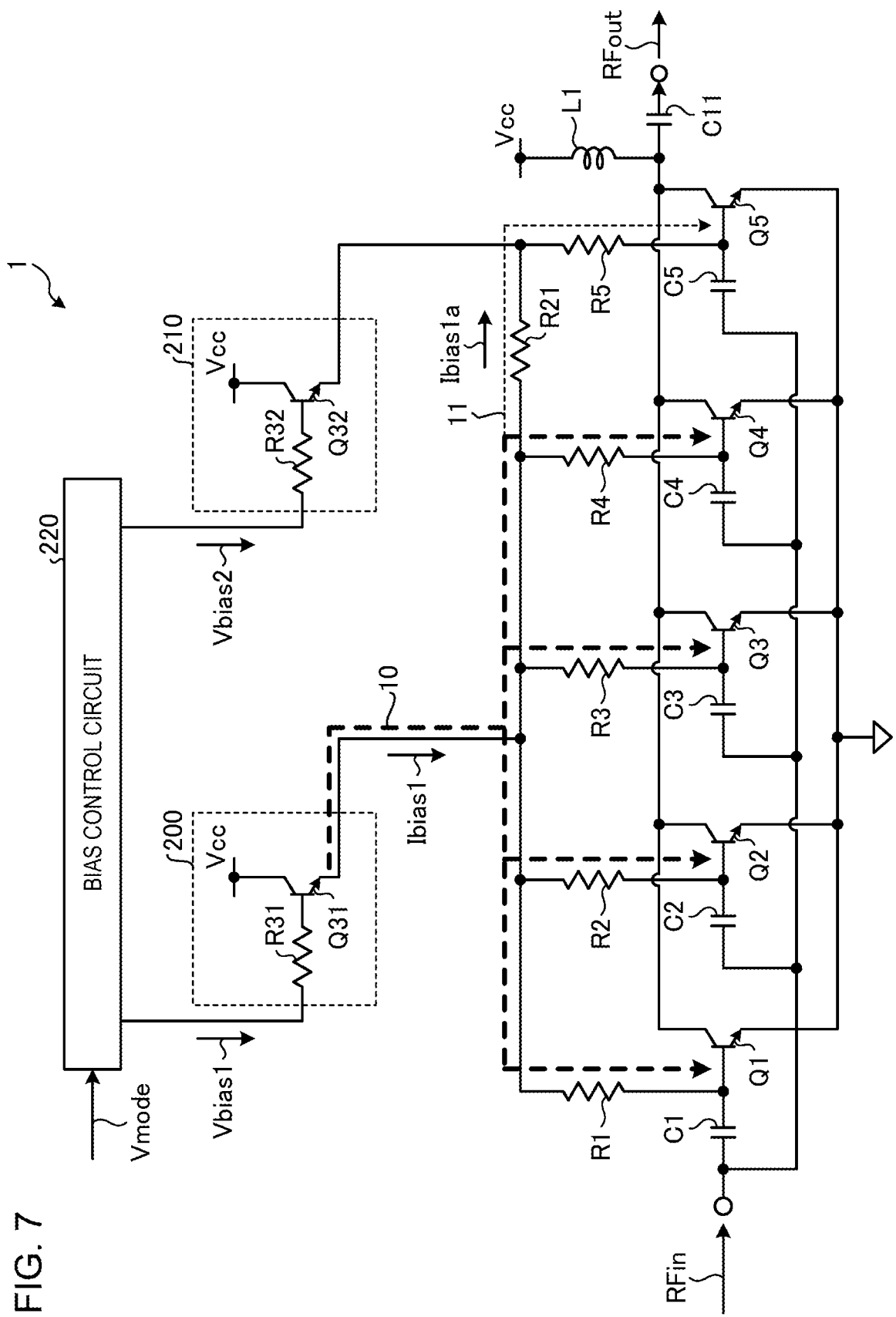
FIG. 7 is a diagram describing the operation of a power amplifier circuit according to the first embodiment.
Figure 8:
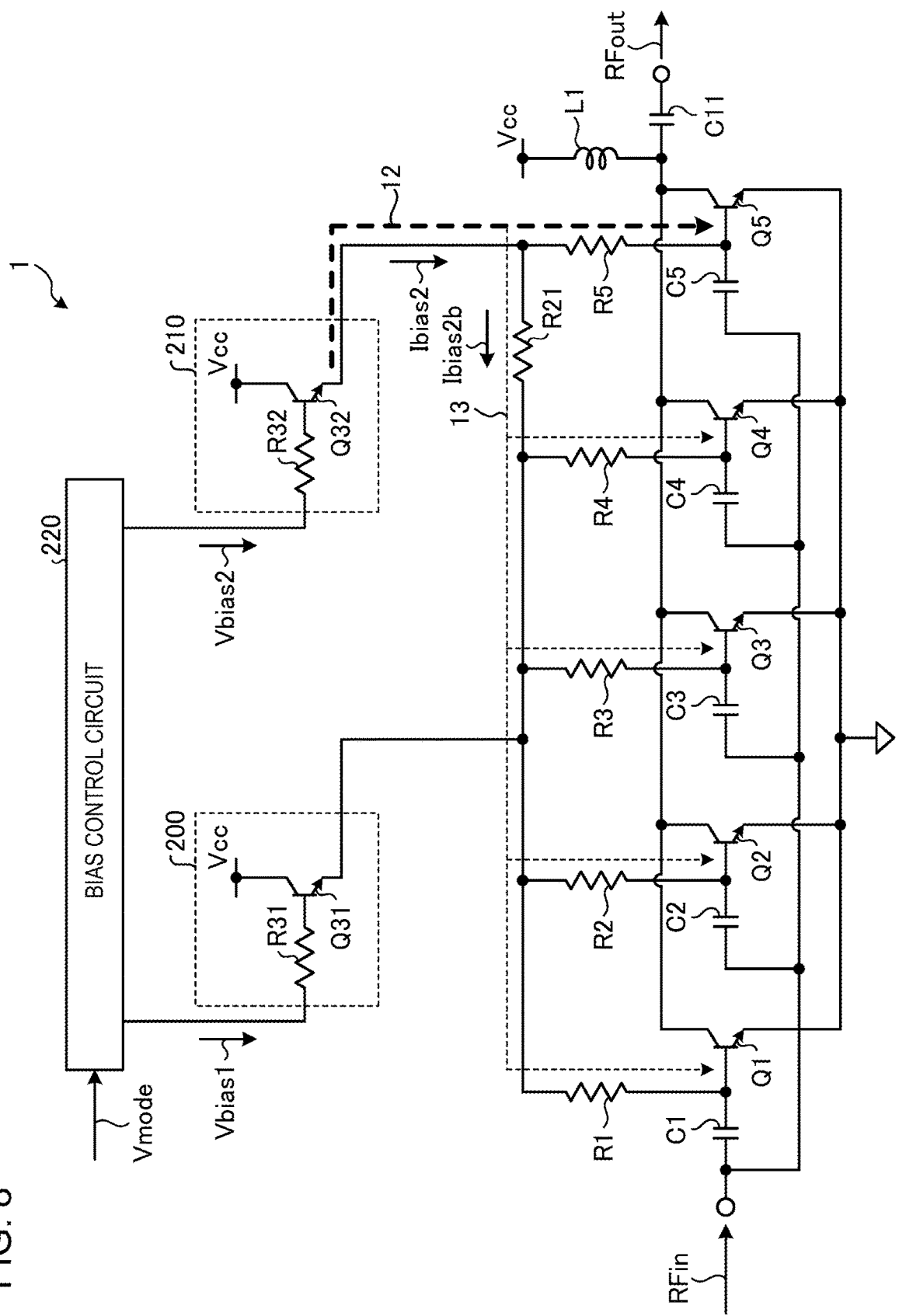
FIG. 8 is a diagram describing the operation of a power amplifier circuit according to the first embodiment.

FIGS. 7 and 8 are diagrams describing the operation of a power amplifier circuit according to the first embodiment. Specifically, FIG. 7 is a diagram describing the operation of the power amplifier circuit 1 in the first operation mode. FIG. 8 is a diagram describing the operation of the power amplifier circuit 1 in the second operation mode.

Referring to FIG. 7, in the first operation mode, the bias control voltage and current Vbias1 is controlled to the high level and the bias control voltage and current Vbias2 is controlled to the low level by the bias control circuit 220. As a result, the transistor Q31 in the bias circuit 200 is turned on and the transistor Q32 in the bias circuit 210 is turned off. Accordingly, the bias current Ibias1 is outputted from the bias circuit 200 as represented by an arrow 10. The bias current Ibias2 is not outputted from the bias circuit 210.

As represented by the arrow 10, large part of the bias current Ibias1 is supplied to the bases of the transistors Q1 to Q4 via the ballast resistors R1 to R4, respectively.

As a result, the transistors Q1 to Q4 are turned on. Accordingly, the radio-frequency input signal RFin is amplified by the transistors Q1 to Q4.

As represented by an arrow 11, a current Ibias1a that is the remainder of the bias current Ibias1 is supplied to the base of the transistor Q5 via the coupling resistor R21 and the ballast resistor R5. The resistance value of the coupling resistor R21 ranges from approximately 1 kΩ to approximately 1.5 kΩ while the resistance values of the ballast resistors R1 to R5 range from approximately 100Ω to approximately 200Ω. Accordingly, the current value of a current Ibias1a is very small. That is, the current value of a current supplied to the base of the transistor Q5 is significantly smaller than that of currents supplied to the bases of the transistors Q1 to Q4. Accordingly, although the transistor Q5 is not completely turned off, the emitter current value per unit emitter area of the transistor Q5 is significantly smaller than that of the transistors Q1 to Q4.

Referring to FIG. 8, in the second operation mode, the bias control voltage and current Vbias1 is controlled to the low level and the bias control voltage and current Vbias2 is controlled to the high level by the bias control circuit 220. As a result, the transistor Q31 in the bias circuit 200 is turned off and the transistor Q32 in the bias circuit 210 is turned on. Accordingly, the bias current Ibias2 is outputted from the bias circuit 210 as represented by an arrow 12. The bias current Ibias1 is not outputted from the bias circuit 200.

Large part of the bias current Ibias2 is supplied to the base of the transistor Q5 via the ballast resistor R5 as represented by the arrow 12.

As a result, the transistor Q5 is turned on. Accordingly, the radio-frequency input signal RFin is amplified by the transistor Q5.

A current Ibias2b that is the remainder of the bias current Ibias2 flows to the ballast resistors R1 to R4 via the coupling resistor R21 as represented by an arrow 13. Part of the current Ibias2b (ideally, a quarter of the current Ibias2b) is supplied to the base of the transistor Q1 via the coupling resistor R21 and the ballast resistor R1. Part of the current Ibias2b (ideally, a quarter of the current Ibias2b) is similarly supplied to the base of the transistor Q2 via the coupling resistor R21 and the ballast resistor R2. Part of the current Ibias2b (ideally, a quarter of the current Ibias2b) is similarly supplied to the base of the transistor Q3 via the coupling resistor R21 and the ballast resistor R3. Part of the current Ibias2b (ideally, a quarter of the current Ibias2b) is similarly supplied to the base of the transistor Q4 via the coupling resistor R21 and the ballast resistor R4.

The resistance value of the coupling resistor R21 ranges from approximately 1 k$\Omega$ to approximately 1.5 k$\Omega$ while the resistance values of the ballast resistors R1 to R5 range from approximately 100$\Omega$ to approximately 200$\Omega$. Accordingly, the current value of a current flowing through the coupling resistor R21 is very small. That is, the current value of the current Ibias2b is significantly smaller than that of the current Ibias2a (see FIG. 5). Accordingly, each of the current values of currents supplied to the bases of the transistors Q1 to Q4 is significantly smaller than that of a current supplied to the base of the transistor Q5. Although the transistors Q1 to Q4 are not completely turned off, each of the emitter current values per unit emitter area of the transistors Q1 to Q4 is therefore significantly smaller than that of the transistor Q5. The gains of the transistors Q1 to Q4 are therefore significantly smaller than those in the first operation mode described with reference to FIG. 7.

The power amplifier circuit 1 changes a gain by switching between the first operation mode and the second operation mode. In the second operation mode, the transistors Q1 to Q4 are not completely turned off in the power amplifier circuit 1. Accordingly, the power amplifier circuit 1 can further suppress the change in an input impedance as compared with the power amplifier circuit 120.

In the second operation mode, the operating points of the transistors Q1 to Q4 in the power amplifier circuit 1 are lower than those of the transistors Q1 to Q4 in the power amplifier circuit 300. Accordingly, in the second operation mode, the gains of the transistors Q1 to Q4 in the power amplifier circuit 1 are lower than those of the transistors Q1 to Q4 in the power amplifier circuit 300. Accordingly, the power amplifier circuit 1 can further suppress a gain as compared with the power amplifier circuit 300 in the second operation mode.

Comparison Between First Embodiment and First Comparative Example

The comparison between the power amplifier circuit 1 according to the first embodiment and the power amplifier circuit 120 according to the first comparative example will be performed by circuit simulation.

Figure 9:
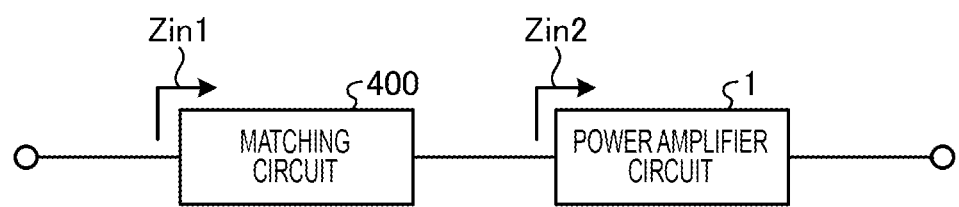
FIG. 9 is a diagram illustrating the simulation circuit of a power amplifier circuit according to the first embodiment.

FIG. 9 is a diagram illustrating the simulation circuit of a power amplifier circuit according to the first embodiment. As illustrated in FIG. 9, a matching circuit 400 is disposed in a stage preceding the power amplifier circuit 1. An impedance when a subsequent stage is viewed from the input of the matching circuit 400 is defined as an impedance Zin1. An impedance when a subsequent stage is viewed from the input of the power amplifier circuit 1 is defined as an input impedance Zin2. The simulation circuit of the power amplifier circuit 120 according to the first comparative example is the same as that in FIG. 9.

Figure 10:
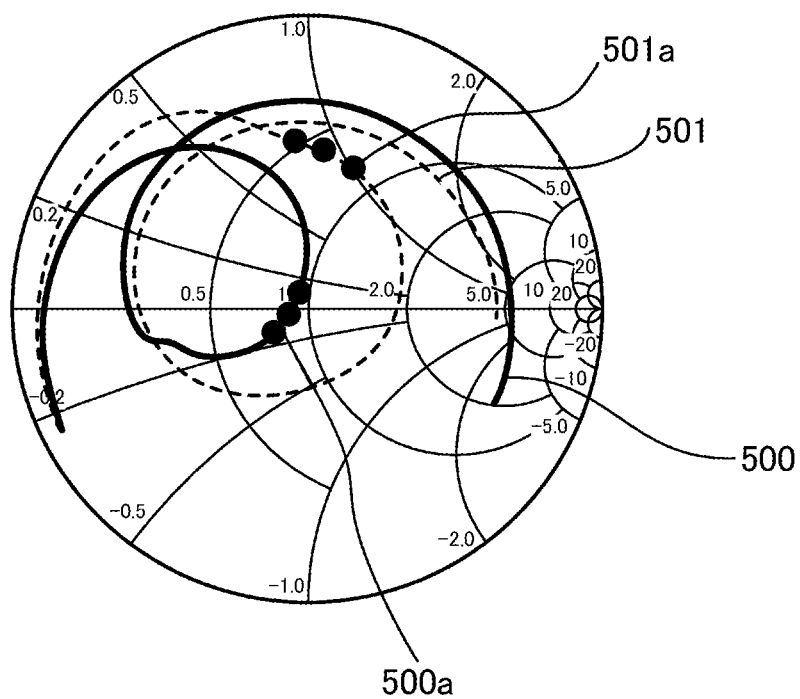
FIG. 10 is a diagram illustrating a result of a circuit simulation of a power amplifier circuit according to the first comparative example.
Figure 11:
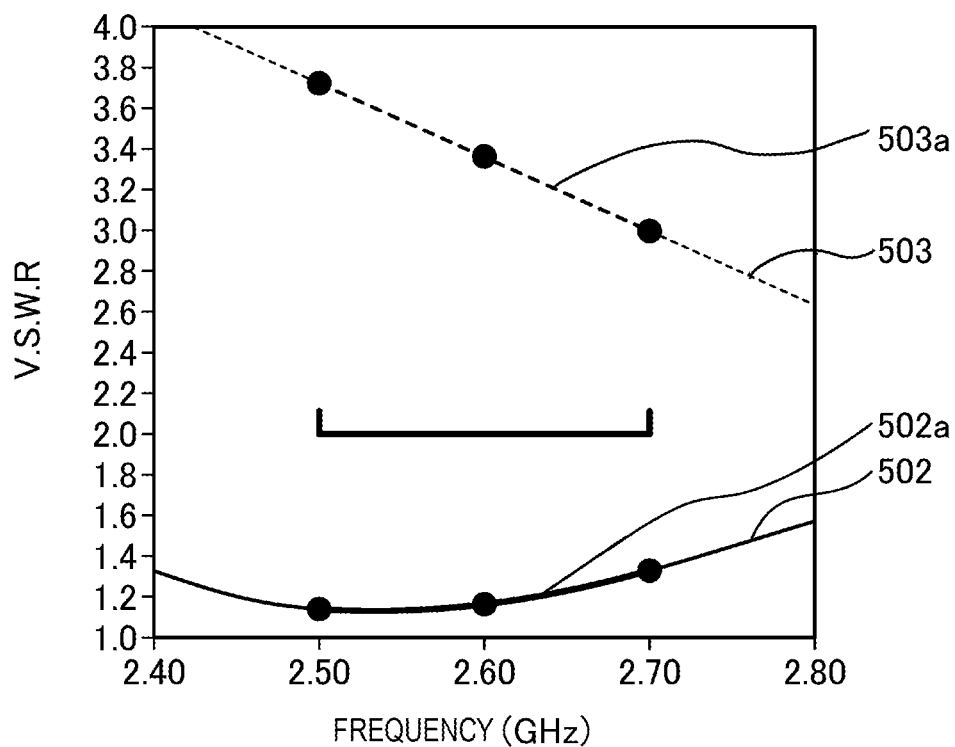
FIG. 11 is a diagram illustrating a result of a circuit simulation of a power amplifier circuit according to the first comparative example.
Figure 12:
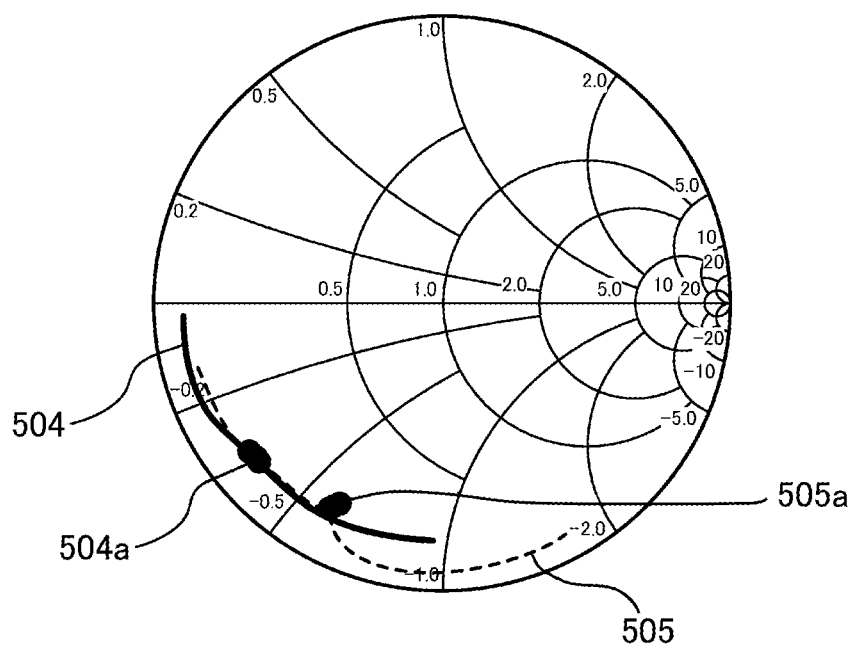
FIG. 12 is a diagram illustrating a result of a circuit simulation of a power amplifier circuit according to the first comparative example.

FIGS. 10 to 12 are diagrams illustrating a result of a circuit simulation of a power amplifier circuit according to the first comparative example.

FIG. 10 is a Smith chart of the impedance Zin1 of the power amplifier circuit 120. A waveform 500 in FIG. 10 represents the impedance Zin1 of the power amplifier circuit 120 in the first operation mode in the frequency range of 1 GHz (gigahertz) to 8.5 GHz. A partial waveform 500a, which is a part of the waveform 500, represents the impedance Zin1 of the power amplifier circuit 120 in the frequency range of 2.5 GHz to 2.7 GHz. A waveform 501 in FIG. 10 represents the impedance Zin1 of the power amplifier circuit 120 in the second operation mode in the frequency range of 1 GHz to 8.5 GHz. A partial waveform 501a, which is a part of the waveform 501, represents the impedance Zin1 of the power amplifier circuit 120 in the frequency range of 2.5 GHz to 2.7 GHz.

FIG. 11 is a diagram illustrating the voltage standing wave ratio (V.S.W.R) of the power amplifier circuit 120. In FIG. 11, the horizontal axis represents frequency (GHz) and the vertical axis represents V.S.W.R.

A waveform 502 in FIG. 11 represents the V.S.W.R of the power amplifier circuit 120 in the first operation mode in the frequency range of 2.40 GHz to 2.80 GHz. A partial waveform 502a, which is a part of the waveform 502, represents the V.S.W.R of the power amplifier circuit 120 in the frequency range of 2.50 GHz to 2.70 GHz. A waveform 503 in FIG. 11 represents the V.S.W.R of the power amplifier circuit 120 in the second operation mode in the frequency range of 2.40 GHz to 2.80 GHz. A partial waveform 503a, which is a part of the waveform 503, represents the V.S.W.R of the power amplifier circuit 120 in the frequency range of 2.50 GHz to 2.70 GHz.

FIG. 12 is a Smith chart of the input impedance Zin2 of the power amplifier circuit 120. A waveform 504 in FIG. 12 represents the input impedance Zin2 of the power amplifier circuit 120 in the first operation mode in the frequency range of 1 GHz to 8.5 GHz. A partial waveform 504a, which is a part of the waveform 504, represents the input impedance Zin2 of the power amplifier circuit 120 in the frequency range of 2.5 GHz to 2.7 GHz. A waveform 505 in FIG. 12 represents the input impedance Zin2 of the power amplifier circuit 120 in the second operation mode in the frequency range of 1 GHz to 8.5 GHz. A partial waveform 505a, which is a part of the waveform 505, represents the input impedance Zin2 of the power amplifier circuit 120 in the frequency range of 2.5 GHz to 2.7 GHz.

Figure 13:
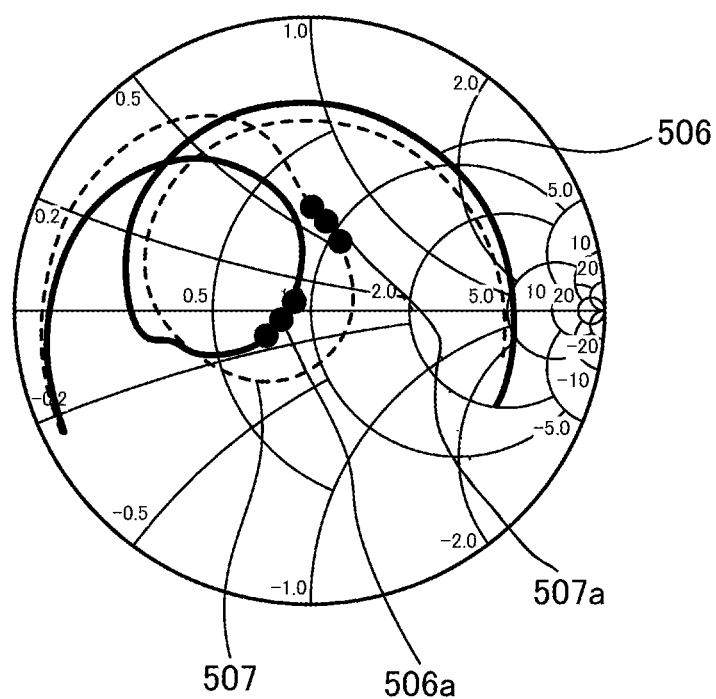
FIG. 13 is a diagram illustrating a result of a circuit simulation of a power amplifier circuit according to the first embodiment.
Figure 14:
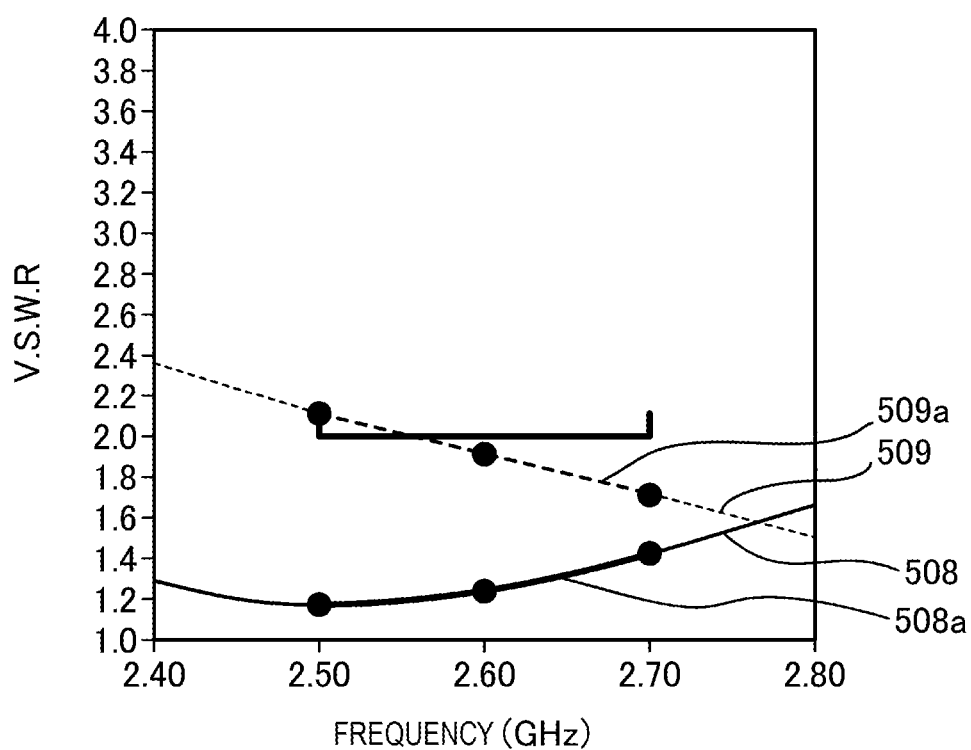
FIG. 14 is a diagram illustrating a result of a circuit simulation of a power amplifier circuit according to the first embodiment.
Figure 15:
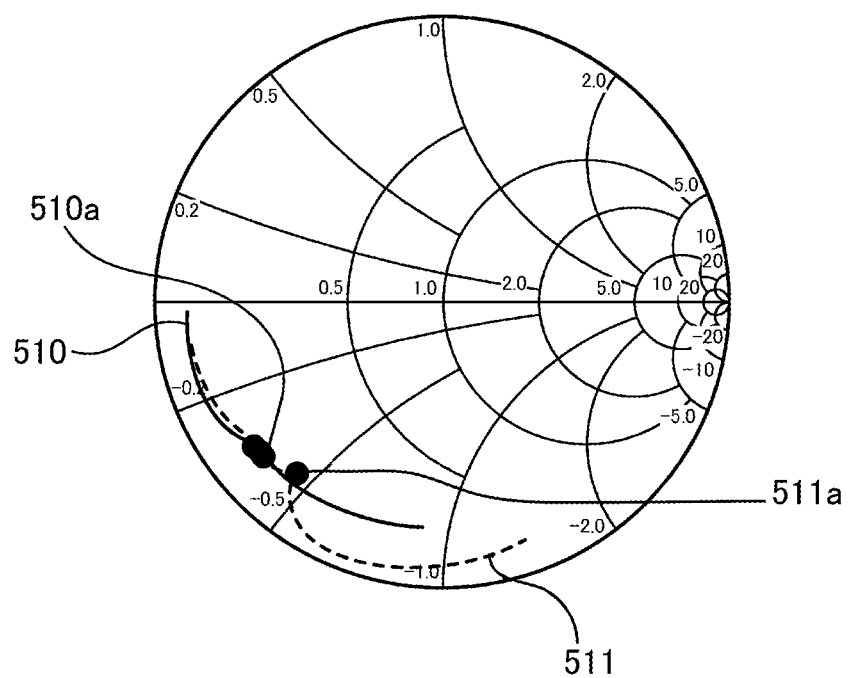
FIG. 15 is a diagram illustrating a result of a circuit simulation of a power amplifier circuit according to the first embodiment.

FIGS. 13 to 15 are diagrams illustrating a result of a circuit simulation of a power amplifier circuit according to the first embodiment.

FIG. 13 is a Smith chart of the impedance Zin1 of the power amplifier circuit 1. A waveform 506 in FIG. 13 represents the impedance Zin1 of the power amplifier circuit 1 in the first operation mode in the frequency range of 1 GHz to 8.5 GHz. A partial waveform 506a, which is a part of the waveform 506, represents the impedance Zin1 of the power amplifier circuit 1 in the frequency range of 2.5 GHz to 2.7 GHz. A waveform 507 in FIG. 13 represents the impedance Zin1 of the power amplifier circuit 1 in the second operation mode in the frequency range of 1 GHz to 8.5 GHz. A partial waveform 507a, which is a part of the waveform 507, represents the impedance Zin1 of the power amplifier circuit 1 in the frequency range of 2.5 GHz to 2.7 GHz.

FIG. 14 is a diagram illustrating the V.S.W.R of the power amplifier circuit 1. In FIG. 14, the horizontal axis represents frequency (GHz) and the vertical axis represents V.S.W.R.

A waveform 508 in FIG. 14 represents the V.S.W.R of the power amplifier circuit 1 in the first operation mode in the frequency range of 2.40 GHz to 2.80 GHz. A partial waveform 508a, which is a part of the waveform 508, represents the V.S.W.R of the power amplifier circuit 1 in the frequency range of 2.50 GHz to 2.70 GHz. A waveform 509 in FIG. 14 represents the V.S.W.R of the power amplifier circuit 1 in the second operation mode in the frequency range of 2.40 GHz to 2.80 GHz. A partial waveform 509a, which is a part of the waveform 509, represents the V.S.W.R of the power amplifier circuit 1 in the frequency range of 2.50 GHz to 2.70 GHz.

FIG. 15 is a Smith chart of the input impedance Zin2 of the power amplifier circuit 1. A waveform 510 in FIG. 15 represents the input impedance Zin2 of the power amplifier circuit 1 in the first operation mode in the frequency range of 1 GHz to 8.5 GHz. A partial waveform 510a, which is a part of the waveform 510, represents the input impedance Zin2 of the power amplifier circuit 1 in the frequency range of 2.5 GHz to 2.7 GHz. A waveform 511 in FIG. 15 represents the input impedance Zin2 of the power amplifier circuit 1 in the second operation mode in the frequency range of 1 GHz to 8.5 GHz. A partial waveform 511a, which is a part of the waveform 511, represents the input impedance Zin2 of the power amplifier circuit 1 in the frequency range of 2.5 GHz to 2.7 GHz.

The comparison between FIGS. 12 and 15 in the frequency range of 2.50 GHz to 2.70 GHz will be performed. The space between the partial waveform 510a (the input impedance Zin2 in the first operation mode) and the partial waveform 511a (the input impedance Zin2 in the second operation mode) in FIG. 15 is narrower than the space between the partial waveform 504a (the input impedance Zin2 in the first operation mode) and the partial waveform 505a (the input impedance Zin2 in the second operation mode) in FIG. 12. That is, the amount of change in the input impedance Zin2 of the power amplifier circuit 1 between the operation modes is smaller than the amount of change in the input impedance Zin2 of the power amplifier circuit 120 between the operation modes.

The comparison between FIGS. 10 and 13 in the frequency range of 2.50 GHz to 2.70 GHz will be performed. The space between the partial waveform 506a (the impedance Zin1 in the first operation mode) and the partial waveform 507a (the impedance Zin1 in the second operation mode) in FIG. 13 is narrower than the space between the partial waveform 500a (the impedance Zin1 in the first operation mode) and the partial waveform 501a (the impedance Zin1 in the second operation mode) in FIG. 10. That is, the amount of change in the impedance Zin1 of the power amplifier circuit 1 between the operation modes is smaller than the amount of change in the impedance Zin1 of the power amplifier circuit 120 between the operation modes. The reason for this is that the amount of change in the input impedance Zin2 of the power amplifier circuit 1 between the operation modes is smaller than the amount of change in the input impedance Zin2 of the power amplifier circuit 120 between the operation modes as described above.

The comparison between FIGS. 11 and 14 in the frequency range of 2.50 GHz to 2.70 GHz will be performed. The V.S.W.R of the power amplifier circuit 1 in the first operation mode represented by the partial waveform 508a in FIG. 14 is substantially the same as that of the power amplifier circuit 120 in the first operation mode represented by the partial waveform 502a in FIG. 11. That is, a standing wave in the power amplifier circuit 1 in the first operation mode is substantially the same as that in the power amplifier circuit 120 in the first operation mode.

The V.S.W.R of the power amplifier circuit 1 in the second operation mode represented by the partial waveform 509a in FIG. 14 is smaller than that of the power amplifier circuit 120 in the second operation mode represented by the partial waveform 503a in FIG. 11. That is, a standing wave in the power amplifier circuit 1 in the second operation mode is smaller than that in the power amplifier circuit 120 in the second operation mode.

As described above, the power amplifier circuit 1 can further suppress the amount of change in the input impedance between the operation modes as compared with the power amplifier circuit 120. Furthermore, the power amplifier circuit 1 can further suppress the standing wave in the second operation mode as compared with the power amplifier circuit 120. As a result, the power amplifier circuit 1 can further suppress the reduction in efficiency in the second operation mode, and so forth as compared with the power amplifier circuit 120.

Comparison Between First Embodiment and Second Comparative Example

The comparison between the power amplifier circuit 1 according to the first embodiment and the power amplifier circuit 300 according to the second comparative example will be performed by circuit simulation.

FIGS. 16 to 20 are diagrams illustrating results of circuit simulations in the first embodiment and the second comparative example.

Figure 16:
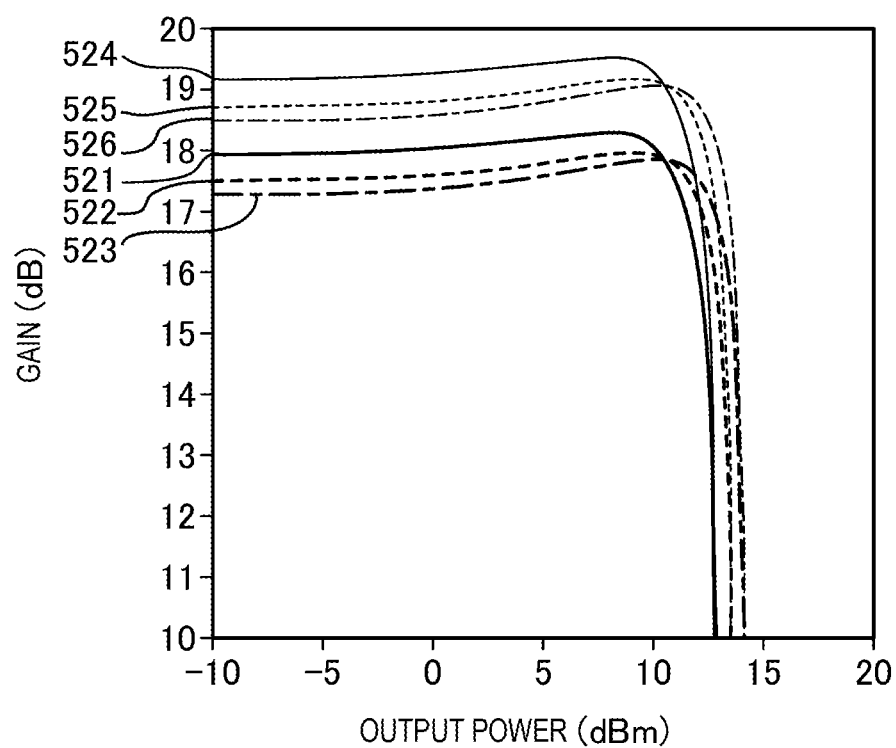
FIG. 16 is a diagram illustrating results of circuit simulations in the first embodiment and the second comparative example.

FIG. 16 is a diagram illustrating the entire gains of the power amplifier circuits 1 and 300 in the second operation mode. In FIG. 16, the horizontal axis represents output power (dBm) and the vertical axis represents gain (dB).

In FIG. 16, a waveform 521 represents the gain of the power amplifier circuit 1 at 2.50 GHz. A waveform 522 represents the gain of the power amplifier circuit 1 at 2.60 GHz. A waveform 523 represents the gain of the power amplifier circuit 1 at 2.70 GHz. A waveform 524 represents the gain of the power amplifier circuit 300 at 2.50 GHz. A waveform 525 represents the gain of the power amplifier circuit 300 at 2.60 GHz. A waveform 526 represents the gain of the power amplifier circuit 300 at 2.70 GHz.

In the comparison between the waveforms 521 and 524, the gain of the power amplifier circuit 1 at 2.50 GHz is lower than that of the power amplifier circuit 300 at 2.50 GHz. In the comparison between the waveforms 522 and 525, the gain of the power amplifier circuit 1 at 2.60 GHz is lower than that of the power amplifier circuit 300 at 2.60 GHz. In the comparison between the waveforms 523 and 526, the gain of the power amplifier circuit 1 at 2.70 GHz is lower than that of the power amplifier circuit 300 at 2.70 GHz.

Accordingly, the power amplifier circuit 1 can further suppress the gain in the second operation mode as compared with the power amplifier circuit 300.

Figure 17:
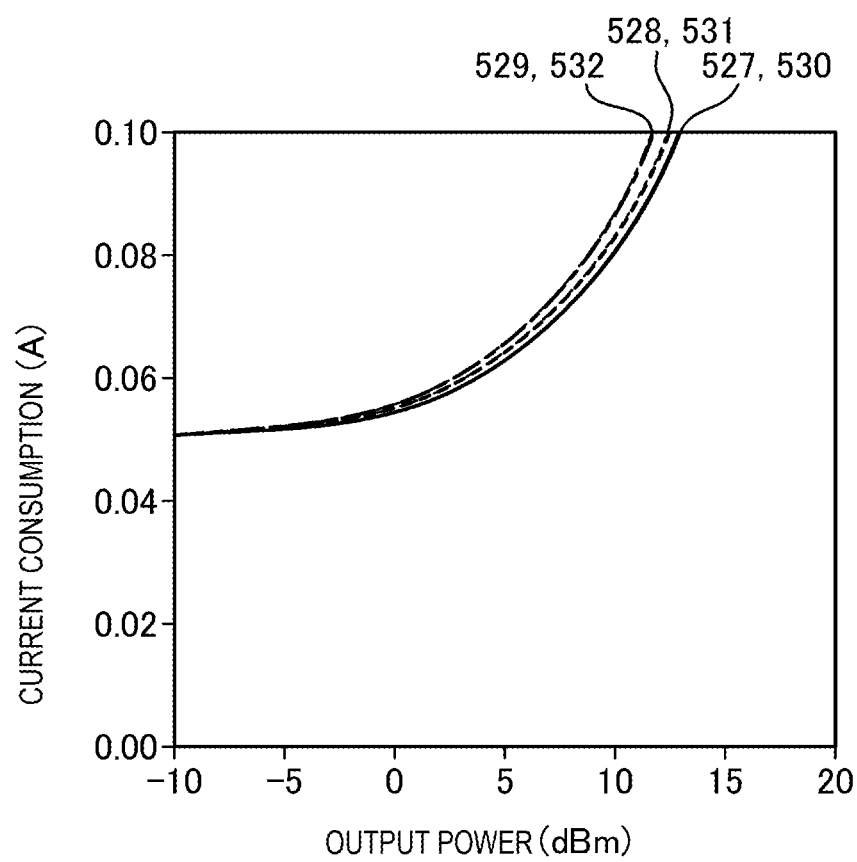
FIG. 17 is a diagram illustrating results of circuit simulations in the first embodiment and the second comparative example.

FIG. 17 is a diagram illustrating the entire current consumptions of the power amplifier circuits 1 and 300 in the second operation mode. In FIG. 17, the horizontal axis represents output power (dBm) and the vertical axis represents current consumption (A (ampere)).

In FIG. 17, a waveform 527 represents the current consumption of the power amplifier circuit 1 at 2.50 GHz. A waveform 528 represents the current consumption of the power amplifier circuit 1 at 2.60 GHz. A waveform 529 represents the current consumption of the power amplifier circuit 1 at 2.70 GHz. A waveform 530 representing the current consumption of the power amplifier circuit 300 at 2.50 GHz substantially overlaps the waveform 527. A waveform 531 representing the current consumption of the power amplifier circuit 300 at 2.60 GHz substantially overlaps the waveform 528. A waveform 532 representing the current consumption of the power amplifier circuit 300 at 2.70 GHz substantially overlaps the waveform 529.

Accordingly, the current consumption of the power amplifier circuit 1 in the second operation mode is substantially the same as that of the power amplifier circuit 300 in the second operation mode.

Figure 18:
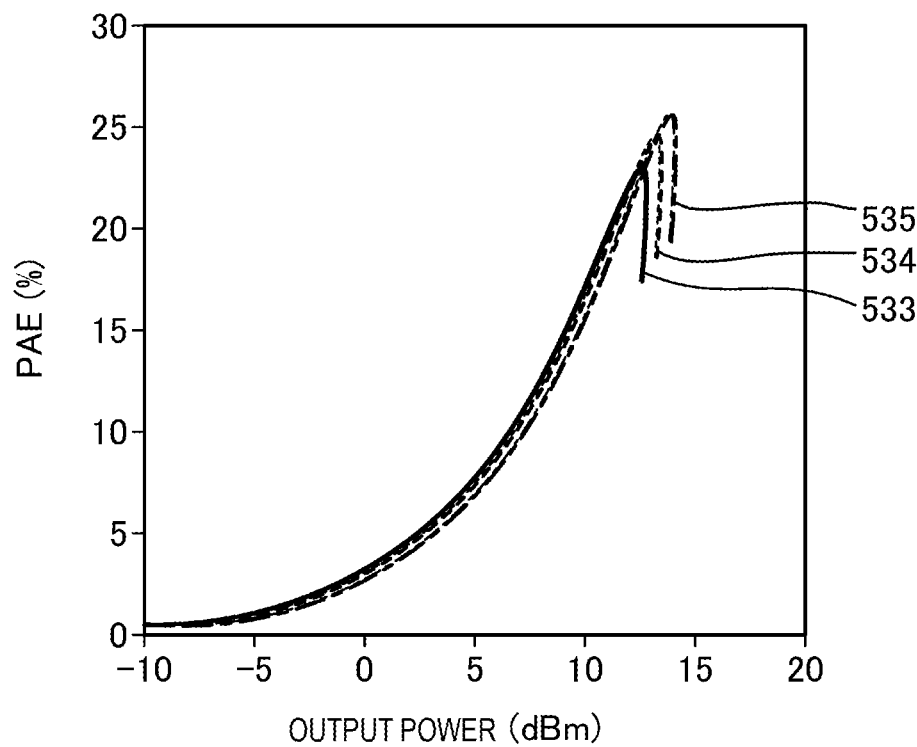
FIG. 18 is a diagram illustrating results of circuit simulations in the first embodiment and the second comparative example.
Figure 19:
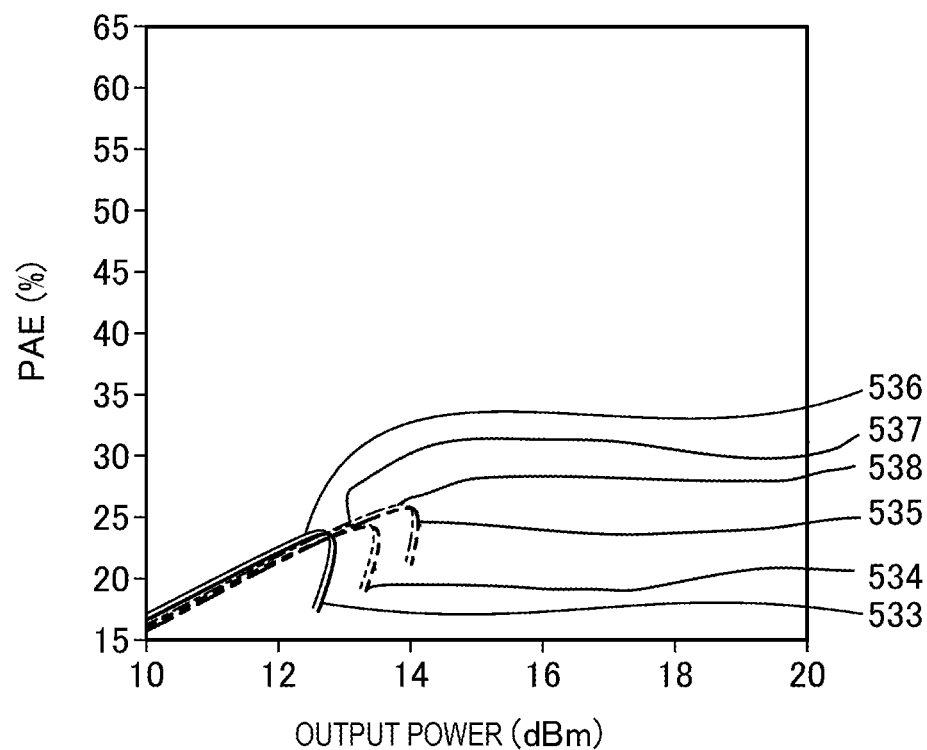
FIG. 19 is a diagram illustrating results of circuit simulations in the first embodiment and the second comparative example.

FIG. 18 is a diagram illustrating the power added efficiencies (PAEs) of the power amplifier circuits 1 and 300 in the second operation mode. In FIG. 18, the horizontal axis represents output power (dBm) and the vertical axis represents PAE (% (percent)). FIG. 19 is a partially enlarged view of FIG. 18.

In FIGS. 18 and 19, a waveform 533 represents the PAE of the power amplifier circuit 1 at 2.50 GHz. A waveform 534 represents the PAE of the power amplifier circuit 1 at 2.60 GHz. A waveform 535 represents the PAE of the power amplifier circuit 1 at 2.70 GHz. In FIG. 19, a waveform 536 represents the PAE of the power amplifier circuit 300 at 2.50 GHz. A waveform 537 represents the PAE of the power amplifier circuit 300 at 2.60 GHz. A waveform 538 represents the PAE of the power amplifier circuit 300 at 2.70 GHz.

The waveforms 533 and 536 substantially overlap. The waveforms 534 and 537 substantially overlap. The waveforms 535 and 538 substantially overlap.

Accordingly, the PAE of the power amplifier circuit 1 in the second operation mode is substantially the same as that of the power amplifier circuit 300 in the second operation mode.

Figure 20:
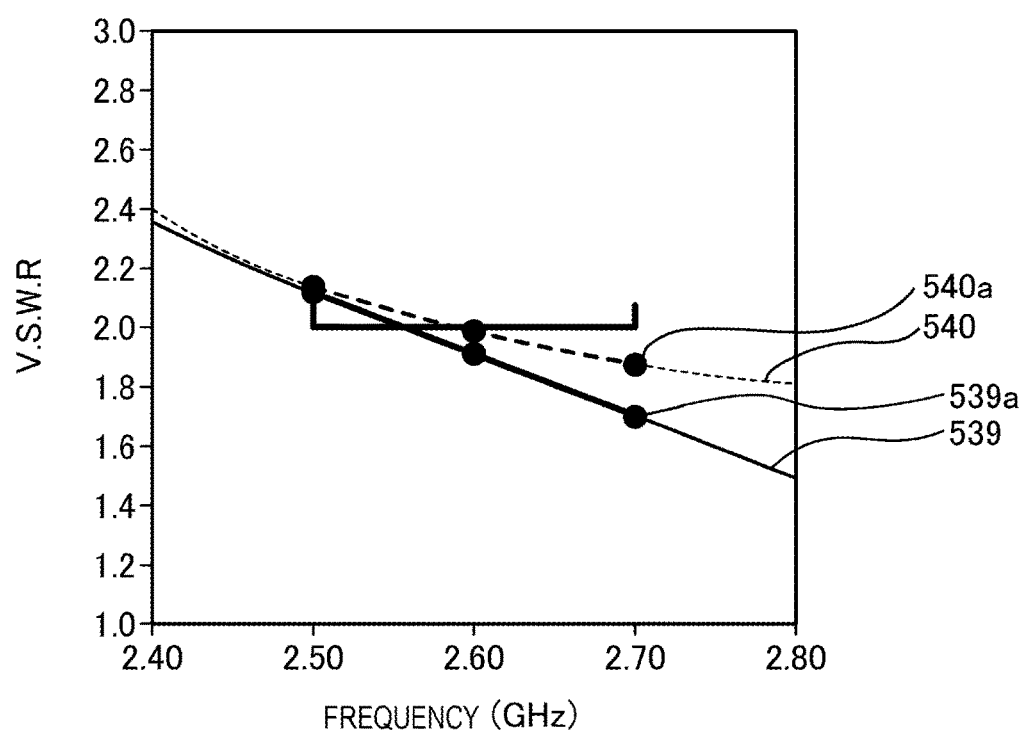
FIG. 20 is a diagram illustrating results of circuit simulations in the first embodiment and the second comparative example.

FIG. 20 is a diagram illustrating the V.S.W.R of each of the power amplifier circuits 1 and 300 in the second operation mode. In FIG. 20, the horizontal axis represents frequency (GHz) and the vertical axis represents V.S.W.R.

In FIG. 20, a waveform 539 represents the V.S.W.R of the power amplifier circuit 1 in the second operation mode in the frequency range of 2.40 GHz to 2.80 GHz. A partial waveform 539a, which is a part of the waveform 539, represents the V.S.W.R of the power amplifier circuit 1 in the frequency range of 2.50 GHz to 2.70 GHz. In FIG. 20, a waveform 540 represents the V.S.W.R of the power amplifier circuit 300 in the second operation mode in the frequency range of 2.40 GHz to 2.80 GHz. A partial waveform 540a, which is a part of the waveform 540, represents the V.S.W.R of the power amplifier circuit 300 in the frequency range of 2.50 GHz to 2.70 GHz.

The V.S.W.R of the power amplifier circuit 1 in the second operation mode represented by the partial waveform 539a is smaller than that of the power amplifier circuit 300 in the second operation mode represented by the partial waveform 540a. That is, a standing wave in the power amplifier circuit 1 in the second operation mode is smaller than that in the power amplifier circuit 300 in the second operation mode.

As described above, the power amplifier circuit 1 can further suppress the gain in the second operation mode while substantially keeping input characteristics as compared with the power amplifier circuit 300.

(Relationship Between Coupling Resistor and Ballast Resistor)

Referring to FIG. 8 again, if the resistance value of the coupling resistor R21 in the power amplifier circuit 1 is much smaller than that of the ballast resistors R1 to R5, the current represented by the arrow 13 becomes large. Accordingly, the operating points of the transistors Q1 to Q4 become high and the gains of the transistors Q1 to Q4 become high. In contrast, if the resistance value of the coupling resistor R21 is much larger than that of ballast resistors R1 to R5, the current represented by the arrow 13 is unlikely to flow. Accordingly, the transistors Q1 to Q4 are turned off and the amount of change in the input impedance of the power amplifier circuit 1 between the operation modes becomes large.

It is therefore considered that there is a desired range of the ratio between the resistance value of the coupling resistor R21 and the resistance values of the ballast resistors R1 to R5.

Figure 21:
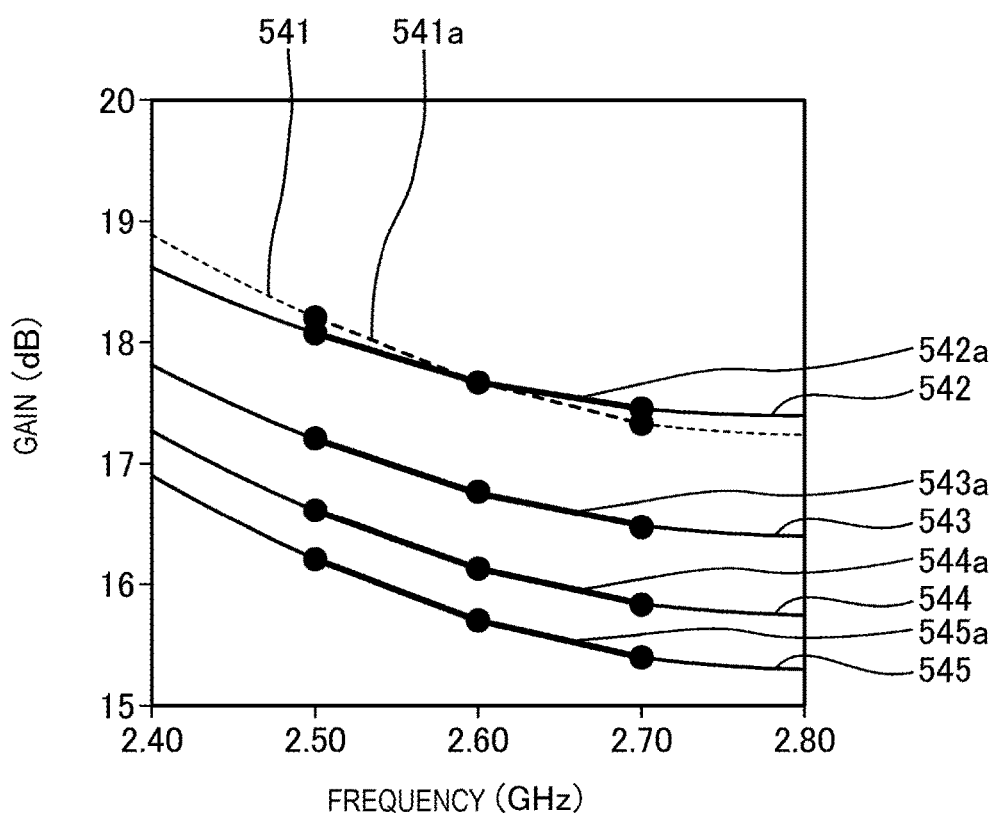
FIG. 21 is a diagram illustrating results of circuit simulations in the first embodiment and the second comparative example.
Figure 22:
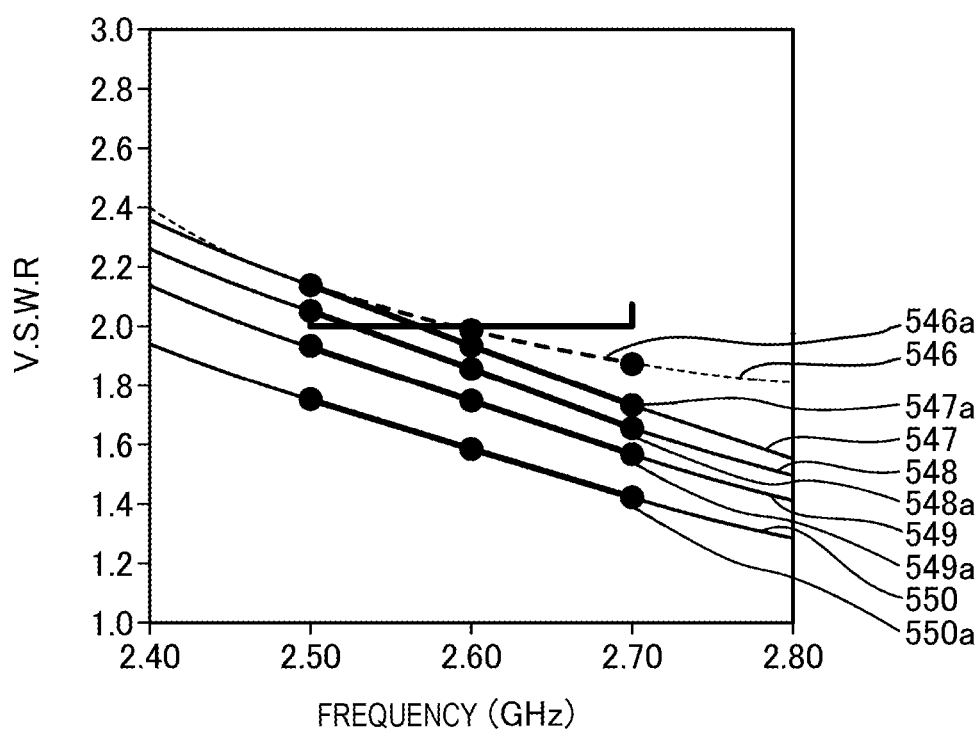
FIG. 22 is a diagram illustrating results of circuit simulations in the first embodiment and the second comparative example.

FIGS. 21 and 22 are diagrams illustrating results of circuit simulations in the first embodiment and the second comparative example.

FIG. 21 is a diagram illustrating the respective entire gains of the power amplifier circuits 1 and 300 in the second operation mode. In FIG. 21, the horizontal axis represents frequency (GHz) and the vertical axis represents gain (dB).

A waveform 541 represents the gain of the power amplifier circuit 300 in the frequency range of 2.40 GHz to 2.80 GHz. A partial waveform 541a, which is a part of the waveform 541, represents the gain of the power amplifier circuit 300 in the frequency range of 2.50 GHz to 2.70 GHz.

A waveform 542 represents the gain of the power amplifier circuit 1 in the frequency range of 2.40 GHz to 2.80 GHz when the resistance value of the coupling resistor R21 is set to a value 2.5 times the resistance value of the ballast resistors R1 to R5. A partial waveform 542a, which is a part of the waveform 542, represents the gain of the power amplifier circuit 1 in the frequency range of 2.50 GHz to 2.70 GHz.

A waveform 543 represents the gain of the power amplifier circuit 1 in the frequency range of 2.40 GHz to 2.80 GHz when the resistance value of the coupling resistor R21 is set to a value 5 times the resistance value of the ballast resistors R1 to R5. A partial waveform 543a, which is a part of the waveform 543, represents the gain of the power amplifier circuit 1 in the frequency range of 2.50 GHz to 2.70 GHz.

A waveform 544 represents the gain of the power amplifier circuit 1 in the frequency range of 2.40 GHz to 2.80 GHz when the resistance value of the coupling resistor R21 is set to a value 7.5 times the resistance value of the ballast resistors R1 to R5. A partial waveform 544a, which is a part of the waveform 544, represents the gain of the power amplifier circuit 1 in the frequency range of 2.50 GHz to 2.70 GHz.

A waveform 545 represents the gain of the power amplifier circuit 1 in the frequency range of 2.40 GHz to 2.80 GHz when the resistance value of the coupling resistor R21 is set to a value 10 times the resistance value of the ballast resistors R1 to R5. A partial waveform 545a, which is a part of the waveform 545, represents the gain of the power amplifier circuit 1 in the frequency range of 2.50 GHz to 2.70 GHz.

As represented by the partial waveform 542a, when the resistance value of the coupling resistor R21 is set to a value 2.5 times the resistance value of the ballast resistors R1 to R5, the gain of the power amplifier circuit 1 in the second operation mode is substantially the same as that of the power amplifier circuit 300 in the second operation mode. As represented by the partial waveforms 543a to 545a, the larger the resistance value of the coupling resistor R21 is, the lower the gain of the power amplifier circuit 1 in the second operation mode is.

Accordingly, it is desired that the resistance value of the coupling resistor R21 be set to a value 2.5 times or more the resistance value of the ballast resistors R1 to R5 from the viewpoint of suppression of the gain of the power amplifier circuit 1 in the second operation mode.

FIG. 22 is a diagram illustrating the V.S.W.R of each of the power amplifier circuits 1 and 300 in the second operation mode. In FIG. 22, the horizontal axis represents frequency (GHz) and the vertical axis represents V.S.W.R.

A waveform 546 represents the V.S.W.R of the power amplifier circuit 300 in the frequency range of 2.40 GHz to 2.80 GHz. A partial waveform 546a, which is a part of the waveform 546, represents the V.S.W.R in the frequency range of 2.50 GHz to 2.70 GHz.

A waveform 547 represents the V.S.W.R of the power amplifier circuit 1 in the frequency range of 2.40 GHz to 2.80 GHz when the resistance value of the coupling resistor R21 is set to a value 10 times the resistance value of the ballast resistors R1 to R5. A partial waveform 547a, which is a part of the waveform 547, represents the V.S.W.R of the power amplifier circuit 1 in the frequency range of 2.50 GHz to 2.70 GHz.

A waveform 548 represents the V.S.W.R of the power amplifier circuit 1 in the frequency range of 2.40 GHz to 2.80 GHz when the resistance value of the coupling resistor R21 is set to a value 7.5 times the resistance value of the ballast resistors R1 to R5. A partial waveform 548a, which is a part of the waveform 548, represents the V.S.W.R of the power amplifier circuit 1 in the frequency range of 2.50 GHz to 2.70 GHz.

A waveform 549 represents the V.S.W.R of the power amplifier circuit 1 in the frequency range of 2.40 GHz to 2.80 GHz when the resistance value of the coupling resistor R21 is set to a value 5 times the resistance value of the ballast resistors R1 to R5. A partial waveform 549a, which is a part of the waveform 549, represents the V.S.W.R of the power amplifier circuit 1 in the frequency range of 2.50 GHz to 2.70 GHz.

A waveform 550 represents the V.S.W.R of the power amplifier circuit 1 in the frequency range of 2.40 GHz to 2.80 GHz when the resistance value of the coupling resistor R21 is set to a value 2.5 times the resistance value of the ballast resistors R1 to R5. A partial waveform 550a, which is a part of the waveform 550, represents the V.S.W.R of the power amplifier circuit 1 in the frequency range of 2.50 GHz to 2.70 GHz.

As represented by the partial waveform 547a, when the resistance value of the coupling resistor R21 is set to a value 10 times the resistance value of the ballast resistors R1 to R5, the V.S.W.R of the power amplifier circuit 1 in the second operation mode at 2.50 GHz is substantially the same as that of the power amplifier circuit 300 in the second operation mode at 2.50 GHz. As represented by the partial waveforms 548a to 550a, the smaller the resistance value of the coupling resistor R21 is, the lower the V.S.W.R of the power amplifier circuit 1 in the second operation mode is.

Accordingly, it is desired that the resistance value of the coupling resistor R21 be set to a value 10 times or less the resistance value of the ballast resistors R1 to R5 from the viewpoint of suppression of the V.S.W.R of the power amplifier circuit 1 in the second operation mode.

In consideration of the above description, it is desired that the resistance value of the coupling resistor R21 be set to a value that is from 2.5 times to 10 times the resistance value of the ballast resistors R1 to R5.

(Summarization)

In the power amplifier circuit 1, large part of the bias current Ibias2 is supplied to the base of the transistor Q5 via the ballast resistor R5 and the remainder of the bias current Ibias2 is supplied to the bases of the transistors Q1 to Q4 via the coupling resistor R21 in the second operation mode. As a result, in the second operation mode in the power amplifier circuit 1, the transistors Q1 to Q4 are not completely turned off. That is, in the power amplifier circuit 1, the number of ON-state transistors is the same in the first and second operation modes. Accordingly, the power amplifier circuit 1 can further suppress the amount of change in the input impedance between the operation modes as compared with the power amplifier circuit 120.

In the second operation mode, the respective operating points of the transistors Q1 to Q4 in the power amplifier circuit 1 are lower than those of the transistors Q1 to Q4 in the power amplifier circuit 300. Accordingly, in the second operation mode, the respective gains of the transistors Q1 to Q4 in the power amplifier circuit 1 are lower than those of the transistors Q1 to Q4 in the power amplifier circuit 300. As a result, the power amplifier circuit 1 can further suppress a gain in the second operation mode as compared with the power amplifier circuit 300.

It is desired that the resistance value of the coupling resistor R21 be set to a value that is from 2.5 times to 10 times the resistance value of the ballast resistors R1 to R5 from the viewpoint of suppression of the gain of the power amplifier circuit 1 in the second operation mode and the suppression of the V.S.W.R. of the power amplifier circuit 1 in the second operation mode.

The five transistors Q1 to Q5 are provided in the power amplifier circuit 1 as amplification transistors, but the number of the amplification transistors may be four or less or six or more. In the first embodiment, the four transistors Q1 to Q4 are used in the first operation mode as the amplification transistors, but the number of the amplification transistors used in the first operation mode may be three or less or five or more. The single transistor Q5 is used in the second operation mode as the amplification transistor, but the number of the amplification transistors used in the second operation mode may be two or more. Here, for example, it is to be noted that the number of the amplification transistors used in the second operation mode is less than that used in the first operation mode because the gain in the second operation mode is lower than that in the first operation mode.

The power amplifier circuit 1 may be used in a multistage amplifier circuit in which a plurality of power amplifier circuits are connected in multiple stages. In this case, the power amplifier circuit 1 may be a first-stage (driver-stage or first-stage) amplifier circuit, a last-stage (power-stage or last-stage) amplifier circuit, or an intermediate-stage amplifier circuit in a multistage amplifier circuit.

In the case where the power amplifier circuit 1 is used as a driver-stage or first-stage amplifier circuit, the characteristics of the radio-frequency output signal RFout are easily affected by the change in the input impedance of the power amplifier circuit 1 because the amplitude of the radio-frequency input signal RFin is small. However, since the amount of change in the input impedance of the power amplifier circuit 1 between the operation modes is small, the effect thereof on the characteristics of the radio-frequency output signal RFout is small.

In the case where the power amplifier circuit 1 is used as a power-stage or last-stage amplifier circuit, the output level of the radio-frequency output signal RFout is easily adjusted with the gain of the power amplifier circuit 1.

Second Embodiment

Figure 23:
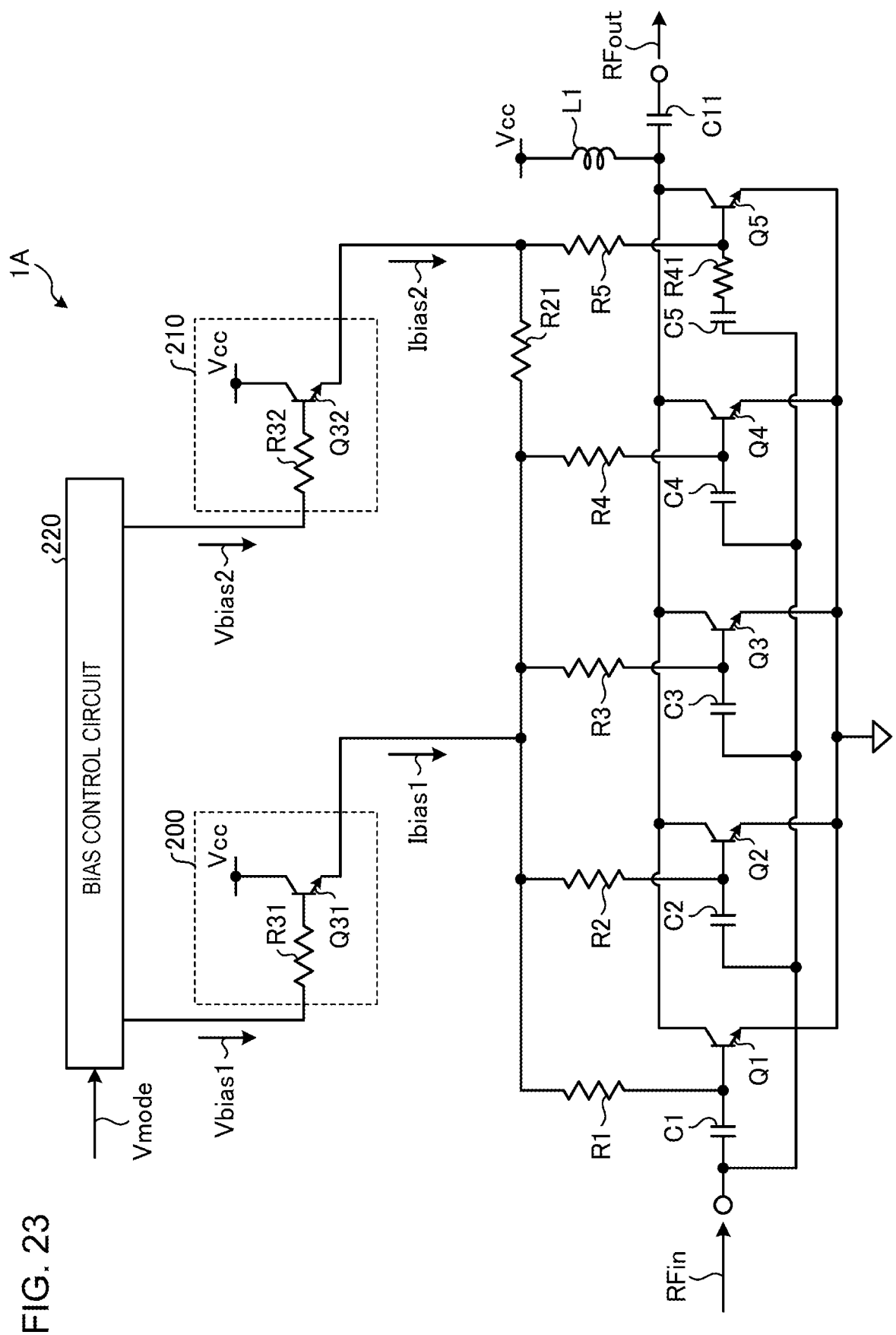
FIG. 23 is a diagram illustrating the configuration of a power amplifier circuit according to a second embodiment.

FIG. 23 is a diagram illustrating the configuration of a power amplifier circuit according to the second embodiment.

A power amplifier circuit 1A differs from the power amplifier circuit 1 according to the first embodiment (see FIG. 6) in that an attenuation resistor R41 is electrically connected between the base of the transistor Q5 and the capacitor C5.

The resistor R41 corresponds to an "at least one fourth resistor" in the present disclosure.

In the power amplifier circuit 1A, the radio-frequency input signal RFin to be inputted to the base of the transistor Q5 is attenuated by the resistor R41. Accordingly, the power amplifier circuit 1A can further suppress the gain in the second operation mode.

In the power amplifier circuit 120 (see FIG. 2) according to the first comparative example, the resistor R41 cannot be provided between the base of the transistor Q5 and the capacitor C5 because the amount of change in the input impedance between the operation modes further increases. On the other hand, in the power amplifier circuit 1A, the amount of change in the input impedance between the operation modes is suppressed because of the presence of the coupling resistor R21. Accordingly, in the power amplifier circuit 1A, the resistor R41 can be provided between the base of the transistor Q5 and the capacitor C5.

Third Embodiment

Figure 24:
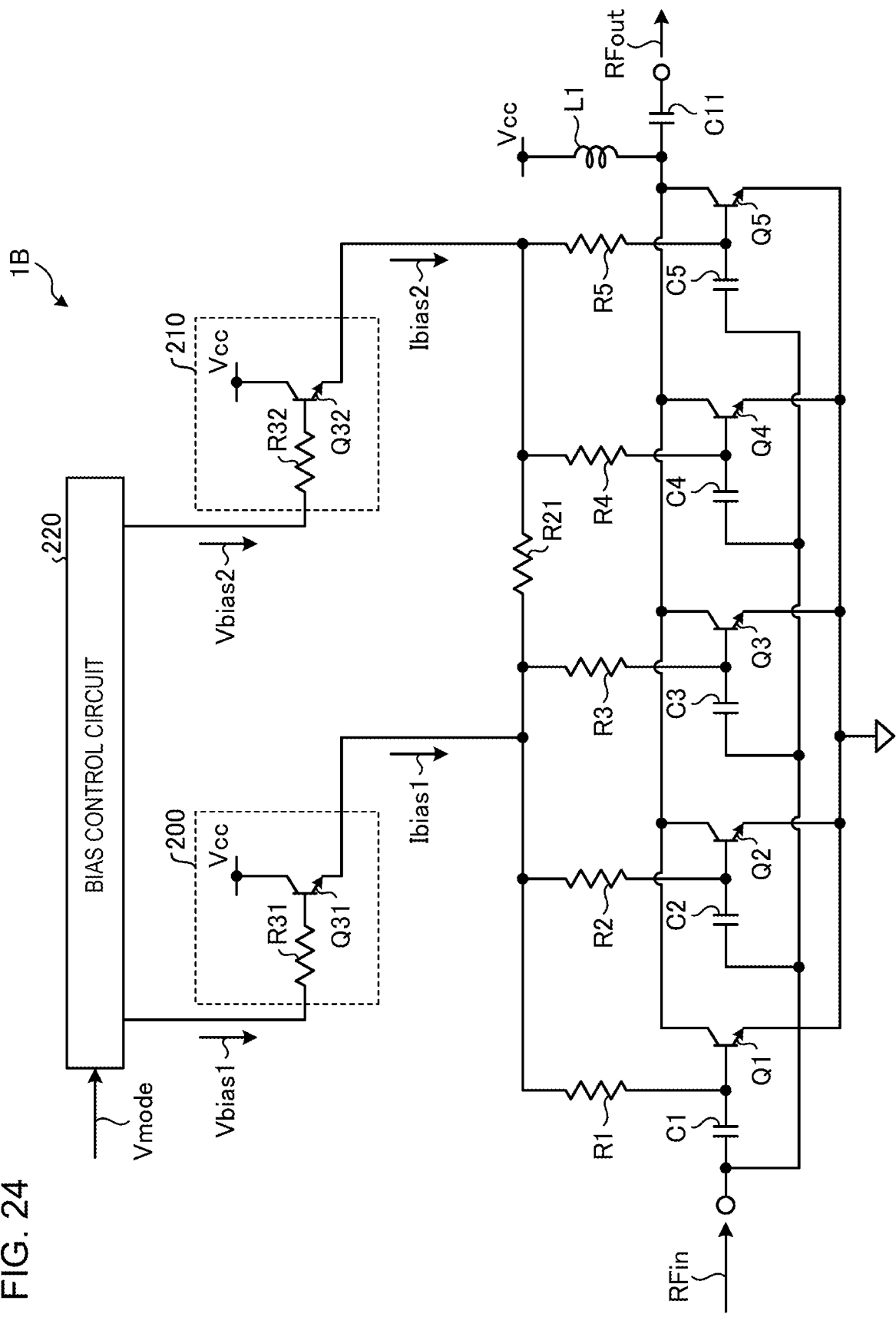
FIG. 24 is a diagram illustrating the configuration of a power amplifier circuit according to a third embodiment.

FIG. 24 is a diagram illustrating the configuration of a power amplifier circuit according to the third embodiment.

A power amplifier circuit 1B differs from the power amplifier circuit 1 according to the first embodiment (see FIG. 6) in the point of connection of the coupling resistor R21.

In the third embodiment, the transistors Q1 to Q3 correspond to "at least one first transistor" in the present disclosure. The transistors Q4 and Q5 correspond to "at least one second transistor" in the present disclosure. The ballast resistors R1 to R3 correspond to "at least one first resistor" in the present disclosure. The ballast resistors R4 and R5 correspond to "at least one second resistor" in the present disclosure.

One end of the coupling resistor R21 is electrically connected to one ends of the ballast resistors R1 to R3. The other end of the coupling resistor R21 is electrically connected to one ends of the ballast resistors R4 and R5.

In the first operation mode, large part of the bias current Ibias1 is supplied to the bases of the transistors Q1 to Q3 via the ballast resistors R1 to R3, respectively.

As a result, the transistors Q1 to Q3 are turned on. Accordingly, the radio-frequency input signal RFin is amplified by the transistors Q1 to Q3.

Part of the remainder of the bias current Ibias1 (ideally, half of the remainder of the bias current Ibias1) is supplied to the base of the transistor Q4 via the coupling resistor R21 and the ballast resistor R4. Part of the remainder of the bias current Ibias1 (ideally, half of the remainder of the bias current Ibias1) is similarly supplied to the base of the transistor Q5 via the coupling resistor R21 and the ballast resistor R5.

In the second operation mode, large part of the bias current Ibias2 is supplied to the bases of the transistors Q4 and Q5 via the ballast resistors R4 and R5, respectively.

As a result, the transistors Q4 and Q5 are turned on. Accordingly, the radio-frequency input signal RFin is amplified by the transistors Q4 and Q5.

Part of the remainder of the bias current Ibias2 (ideally, one-third of the remainder of the current Ibias2) is supplied to the base of the transistor Q1 via the coupling resistor R21 and the ballast resistor R1. Part of the remainder of the bias current Ibias2 (ideally, one-third of the remainder of the current Ibias2) is similarly supplied to the base of the transistor Q2 via the coupling resistor R21 and the ballast resistor R2. Part of the remainder of the bias current Ibias2 (ideally, one-third of the remainder of the current Ibias2) is similarly supplied to the base of the transistor Q3 via the coupling resistor R21 and the ballast resistor R3.

The five transistors Q1 to Q5 are provided in the power amplifier circuit 1B as amplification transistors, but the number of the amplification transistors may be four or less or six or more. The three transistors Q1 to Q3 are used in the first operation mode as the amplification transistors, but the number of the amplification transistors used in the first operation mode may be two or less or four or more. The two transistors Q4 and Q5 are used in the second operation mode as the amplification transistors, but the number of the amplification transistors used in the second operation mode may be one or three or more. Here, for example, it is to be noted that the number of the amplification transistors used in the second operation mode is less than that used in the first operation mode because the gain in the second operation mode is lower than that in the first operation mode.

In the power amplifier circuit 1B, the number of the amplification transistors used in the first operation mode and the number of the amplification transistors used in the second operation mode can be adjusted by changing the point of connection of the coupling resistor R21. The power amplifier circuit 1B therefore can adjust the gain in the first operation mode and the gain in the second operation mode.

The third embodiment and the second embodiment may be combined. That is, an attenuation resistor may be provided not only between the base of the transistor Q4 and the capacitor C4 but also between the base of the transistor Q5 and the capacitor C5 in the power amplifier circuit 1B. In this case, the power amplifier circuit 1B can suppress the gain in the second operation mode.

The embodiments described above are intended to help easily understand the present disclosure and is not to be used to construe the present disclosure in a limiting fashion. The present disclosure may be modified or improved without departing from the gist thereof, and equivalents of such modifications or improvements are also included in the present disclosure. While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplifier circuit comprising:
a first transistor having a first terminal to which a first signal is input, and a second terminal;
a second transistor having a first terminal to which the first signal is input, and a second terminal that is electrically connected to the second terminal of the first transistor;
a first resistor having a first end to which a first bias current is supplied, and a second end that is electrically connected to the first terminal of the first transistor;
a second resistor having a first end to which a second bias current is supplied, and a second end that is electrically connected to the first terminal of the second transistor; and
a third resistor having a first end that is electrically connected to the first end of the first resistor, and a second end that is electrically connected to the first end of the second resistor.

2. The power amplifier circuit according to claim 1,
wherein, in a first operation mode, part of the first bias current is supplied to the first terminal of the first transistor via the first resistor, and a remainder of the first bias current is supplied to the first terminal of the second transistor via the third resistor and via the second resistor,
wherein, in a second operation mode, part of the second bias current is supplied to the first terminal of the second transistor via the second resistor, and a remainder of the second bias current is supplied to the first terminal of the first transistor via the third resistor and via the first resistor,
wherein a gain of the power amplifier circuit is lower in the second operation mode than in the first operation mode, and
wherein a second signal obtained by amplifying the first signal is output from the second terminal of the first transistor and from the second terminal of the second transistor.

3. The power amplifier circuit according to claim 1, further comprising a fourth resistor having a first end to which the first signal is input, and a second end that is electrically connected to the first terminal of the second transistor.

4. The power amplifier circuit according to any one of claim 1, wherein a resistance value of the third resistor is from 2.5 times to 10 times a resistance value of the first resistor and of the second resistor.

5. The power amplifier circuit according to claim 1, wherein the power amplifier circuit is a driver-stage amplifier circuit in a multistage amplifier circuit.

6. The power amplifier circuit according to claim 1, wherein the power amplifier circuit is a power-stage amplifier circuit in a multistage amplifier circuit.

7. The power amplifier circuit according to claim 1, wherein the first transistor and the second transistor are bipolar transistors.

8. The power amplifier circuit according to claim 1, further comprising:
a first bias circuit that is connected to the first resistor, thereby forming an emitter follower, the first bias circuit being configured to supply the first bias current to the first end of the first resistor in the first operation mode; and
a second bias circuit that is connected to second resistor, thereby forming an emitter follower, the second bias circuit being configured to supply the second bias current to the first end of the second resistor in the second operation mode.

9. The power amplifier circuit according to claim 1, comprising a plurality of first transistors, a plurality of second transistors, a plurality of first resistors, and a plurality of second resistors.

* * * * *